(12) United States Patent
Hiyama

(10) Patent No.: US 9,511,379 B2
(45) Date of Patent: *Dec. 6, 2016

(54) GAS-INTAKE-PORT ARRAY STRUCTURE AND SOLDERING APPARATUS

(71) Applicant: Senju Metal Industry Co., Ltd., Tokyo (JP)

(72) Inventor: Tsutomu Hiyama, Tokyo (JP)

(73) Assignee: Senju Metal Industry Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/654,939

(22) PCT Filed: Dec. 20, 2013

(86) PCT No.: PCT/JP2013/084295
§ 371 (c)(1),
(2) Date: Jun. 23, 2015

(87) PCT Pub. No.: WO2014/103945
PCT Pub. Date: Jul. 3, 2014

(65) Prior Publication Data
US 2015/0343460 A1 Dec. 3, 2015

(30) Foreign Application Priority Data

Dec. 28, 2012 (JP) .................................. 2012-288292

(51) Int. Cl.
*B05B 1/14* (2006.01)
*B05B 1/00* (2006.01)
(Continued)

(52) U.S. Cl.
CPC ............... *B05B 1/005* (2013.01); *B23K 1/008* (2013.01); *B23K 1/0016* (2013.01); *B23K 1/012* (2013.01);
(Continued)

(58) Field of Classification Search
CPC ........... B05B 1/005; B23K 3/04; B23K 1/012; B23K 1/008; H05K 3/34; H05K 3/3494; H05K 2203/081
(Continued)

(56) References Cited

U.S. PATENT DOCUMENTS 4,775,775 A * 10/1988 Spigarelli .......... G05D 23/1934
219/508
5,296,680 A * 3/1994 Yamada ................. B23K 1/008
219/388
(Continued)

FOREIGN PATENT DOCUMENTS

DE 102007059654 A1 6/2009
JP 410284831 A 10/1998
(Continued)

OTHER PUBLICATIONS

Search Report from corresponding International patent application No. PCT/JP2013/084295, mailing date of search report: Feb. 10, 2014, English translation 2 pgs.
(Continued)

*Primary Examiner* — Arthur O Hall
*Assistant Examiner* — Joel Zhou
(74) *Attorney, Agent, or Firm* — Chernoff, Vilhauer, McClung & Stenzel, LLP

(57) ABSTRACT

In a gas-intake-port array structure, which enables any temperature fluctuation during conveying time of a printed circuit board, a semiconductor wafer or the like to be reduced and allows the printed circuit board and the like to be very uniformly heated or cooled, a nozzle pattern P2 is arranged to be line symmetry with a nozzle pattern P1 in one upper or lower divided section of a nozzle layout region of the nozzle cover 3 relative to a center portion that is orthogonal to a conveying direction, as shown in FIG. 1. In
(Continued)

order for the arrangement patterns diagonally arranged in the nozzle layout region to become identical, the nozzle pattern P1 is arranged to be line symmetry with the nozzle pattern P2 in the other upper or lower divided section. Intake ports 3b, 3c and 3d each having a predetermined opening width are arranged between two blowing nozzles 2 or more and across a first row thereof and plural other rows having different phases, in order to circulate the gas blown from the blowing nozzles 2. Widths of the intake ports 3b, 3c and 3d are set so that they are gradually become narrower with increasing distance from the center portion.

4 Claims, 19 Drawing Sheets

(51) Int. Cl.
| | | |
|---|---|---|
| *B23K 1/012* | (2006.01) | |
| *B23K 1/008* | (2006.01) | |
| *H05K 3/34* | (2006.01) | |
| *B23K 3/04* | (2006.01) | |
| *B23K 1/00* | (2006.01) | |
| *F27B 9/02* | (2006.01) | |
| *F27B 9/06* | (2006.01) | |
| *F27B 9/10* | (2006.01) | |

(52) U.S. Cl.
CPC . *B23K 3/04* (2013.01); *F27B 9/02* (2013.01); *F27B 9/06* (2013.01); *F27B 9/10* (2013.01); *H05K 3/3494* (2013.01); *H05K 2203/081* (2013.01)

(58) Field of Classification Search
USPC .......................................... 239/556, 557, 560
See application file for complete search history.

(56) References Cited

U.S. PATENT DOCUMENTS

| | | | | | |
|---|---|---|---|---|---|
| 5,338,008 | A * | 8/1994 | Okuno | ................. | H05K 3/3494 266/105 |
| 5,364,007 | A * | 11/1994 | Jacobs | ................. | B23K 3/0646 219/390 |
| 5,405,074 | A * | 4/1995 | Den Dopper | ......... | B23K 1/008 219/388 |
| 5,440,101 | A * | 8/1995 | Cox | ....................... | B23K 1/008 219/388 |
| 5,785,237 | A * | 7/1998 | Lasto | .................... | B23K 1/012 228/180.22 |
| 6,386,422 | B1 * | 5/2002 | Cheng | ................... | B23K 1/008 228/46 |
| 8,113,190 | B2 * | 2/2012 | Dougherty | ............... | A21B 1/48 126/15 A |
| 2001/0055740 | A1 * | 12/2001 | Bloom | ................... | B23K 1/008 432/247 |
| 2002/0020695 | A1 * | 2/2002 | Yokota | ................... | B23K 1/008 219/388 |
| 2002/0073574 | A1 * | 6/2002 | Durdag | ............... | B23K 1/0016 34/201 |
| 2002/0139007 | A1 * | 10/2002 | Yoshida | .................. | F26B 3/283 34/624 |
| 2004/0063058 | A1 * | 4/2004 | Orbeck | ................. | B23K 1/008 432/128 |
| 2005/0178814 | A1 * | 8/2005 | Yokota | ..................... | B23K 3/04 228/43 |
| 2009/0134142 | A1 * | 5/2009 | Nakamura | ............. | B23K 1/008 219/420 |
| 2011/0315746 | A1 | 12/2011 | Dautenhahn | | |
| 2012/0178039 | A1 * | 7/2012 | Kagaya | ................ | B23K 1/0016 432/219 |
| 2014/0252607 | A1 * | 9/2014 | Miyauchi | ........... | H01L 21/4853 257/737 |
| 2015/0173209 | A1 | 6/2015 | Dhavaleswarapu et al. | | |

FOREIGN PATENT DOCUMENTS

| | | |
|---|---|---|
| JP | H11-307927 A | 11/1999 |
| JP | 2002-331357 A | 11/2002 |
| JP | 2004-214535 A | 7/2004 |
| JP | 2005 175288 A | 6/2005 |
| JP | 2007-266100 A | 10/2007 |
| WO | 2006/075803 A1 | 7/2006 |
| WO | 2006128985 A1 | 12/2006 |
| WO | 2007/004780 A1 | 1/2007 |
| WO | 2007/116666 A1 | 10/2007 |
| WO | 2011/036948 A1 | 3/2011 |
| WO | 2011/135737 A1 | 11/2011 |

OTHER PUBLICATIONS

PCT, International Preliminary Report on Patentability (Chapter I of the Patent Cooperation Treaty) including English Translation for International Application No. PCT/JP2013/084295, mailed Jul. 9, 2015 (Jul. 9, 2015), 6 pages.

Supplementary European Search Report prepared by the European Patent Office for EP 13868049, mailed Aug. 11, 2016, 9 pages.

Search Report from corresponding International patent application No. PCT/JP2013/084296, mailing date: Feb. 10, 2014, English translation 2 pgs.

International Preliminary Report on Patentability from corresponding International patent application No. PCT/JP2013/084296, mailing date: Jun. 30, 2015, English translation 6 pgs.

\* cited by examiner (UNIT:°C)

| ELAPSED TIME [sec] | MEASUREMENT POINTS | | | | | | | | | DIFFERENCE BETWEEN PEAK TEMPERATURES $\Delta t =$ $\theta \max$ $- \theta \min$ |
| --- | --- | --- | --- | --- | --- | --- | --- | --- | --- | --- |
| | (1) | (2) | (3) | (4) | (5) | (6) | (7) | (8) | (9) | |
| 0 | 30.0 | 30.0 | 30.0 | 30.0 | 30.0 | 30.0 | 30.0 | 30.0 | 30.0 | |
| 30 | 35.0 | 35.0 | 35.0 | 30.5 | 30.5 | 30.5 | 30.5 | 30.5 | 30.5 | |
| 60 | 100.0 | 100.0 | 100.0 | 50.0 | 55.0 | 60.0 | 40.0 | 40.0 | 40.0 | |
| 90 | 170.0 | 170.0 | 170.0 | 160.0 | 160.0 | 160.0 | 140.0 | 140.0 | 145.0 | |
| 120 | 180.0 | 180.0 | 180.0 | 175.0 | 175.0 | 175.0 | 170.5 | 170.5 | 170.5 | |
| 150 | 180.0 | 180.0 | 180.0 | 180.0 | 180.0 | 180.0 | 180.0 | 180.0 | 180.0 | |
| 180 | 190.0 | 190.0 | 190.0 | 185.0 | 185.0 | 185.0 | 185.0 | 185.0 | 185.0 | |
| 210 | 225.0 | 225.0 | 195.0 | 215.0 | 215.0 | 215.0 | 195.0 | 195.0 | 195.0 | |
| 240 | 235.0 | 235.0 | 235.0 | 235.0 | 235.0 | 235.0 | 235.0 | 235.0 | 235.0 | |
| 270 | 150.0 | 140.0 | 155.0 | 175.5 | 175.5 | 170.0 | 200.0 | 205.0 | 200.0 | |
| 300 | 110.0 | 105.0 | 120.0 | 120.0 | 120.0 | 130.0 | 130.0 | 130.0 | 140.0 | |
| 330 | 95.5 | 95.0 | 110.0 | 115.0 | 115.0 | 120.0 | 115.5 | 110.0 | 120.5 | |
| PEAK TEMPERATURE /TIME | 237.5 /235 $\theta \min$ | 239.8 /235 | 238.6 /235 | 237.6 /245 | 239.6 /245 | 239.2 /245 | 237.8 /255 | 240.4 /255 $\theta \max$ | 239.5 /255 | 2.9°C |

| LINES | MEASUREMENT POINTS | PEAK TEMPERATURE °C |
|---|---|---|
| ——— | (1) | 237. 5 |
| ------- | (2) | 239. 8 |
| — — — | (3) | 238. 6 |
| —··— | (4) | 237. 6 |
| – – – – | (5) | 239. 6 |
| ——— | (6) | 239. 2 |
| ------- | (7) | 237. 8 |
| — — — | (8) | 240. 4 |
| —·—·— | (9) | 239. 5 |

Δt=2. 9°C
EACH MEASUREMENT POINT IS 10mm AWAY FROM END OF BOARD

| FIXED RAIL | (1) (2) (3) | MOVABLE RAIL |
| | (4) (5) (6) | |
| | (7) (8) (9) | |

GAS-INTAKE-PORT ARRAY STRUCTURE AND SOLDERING APPARATUS

CROSS-REFERENCE TO RELATED APPLICATIONS

This is a national stage application filed under 35 USC 371 based on International Application No. PCT/JP2013/084295 filed Dec. 20, 2013 and claims priority under 35 USC 119 of Japanese Patent Application No. 2012-288292 filed Dec. 28, 2012.

TECHNICAL FIELD

The present invention relates to a gas-intake-port array structure and a soldering apparatus, the gas-intake-port array structure being applicable to a nozzle device that blows heated air to a conveyed member such as a printed circuit board, a semiconductor wafer or the like in a heating zone and blows cooled air to the member in a cooling zone and a reflow furnace mounting the nozzle device.

BACKGROUND

When soldering electronic components on the printed circuit board, the reflow furnace which solders them by fusing solder paste in which solder powder and flux are mixed has been often used in recent years. The reflow furnace contains a preliminary heating zone, a heating zone and a cooling zone within a tunnel muffle. The preliminary heating zone and the heating zone are provide with heaters for heating and the cooling zone is provided with a cooling mechanism being constituted of cooling water pipes, cooling fun or the like.

The reflow furnace is provided with a heated-air-blowing nozzle for blowing the heated air into the muffle. The heated-air-blowing nozzle blows the heated air, which has been heated by the heater, from the nozzle for blowing the heated air into the heating zone in the reflow furnace by the fun(s) driven by a motor. Thus, the heated-air-blowing nozzle forces the heated air to enter any shadow portion by the electronic component(s) and/or any small gap (for example, through-holes) so that the whole printed circuit board can be uniformly heated.

As the heated-air-blowing nozzle provided in the reflow furnace, the nozzles of multi-hole type in which the heated air is blown from the multi-holes have been used. In the nozzles of multi-hole type, a speed of the heated air is faster than that of the nozzle of single-hole type and the multiple holes causes no deficiency of a flow rate of the heated air. Therefore, the nozzles of multi-hole type have excellent heating efficiency. From this, in the reflow furnace, the nozzles of multi-hole type in which the heated air is blown from the multi-holes have been often used.

According to a popular reflow furnace, multiple heated-air-blowing nozzles are respectively arranged in upper and lower portions of the preliminary heating zone and heating zone along a conveying direction of the printed circuit board. For example, in the preliminary heating zone constituted of five zones, a total of ten heated-air-blowing nozzles is arranged with every five nozzles being respectively arranged in the upper or lower portion thereof. Further, in a case where the heating zone is constituted of three zones, a total of six heated-air-blowing nozzles is arranged with every three nozzles being respectively arranged in the upper or lower portion thereof. In one reflow furnace, a total of sixteen heated-air-blowing nozzles is arranged with every eight nozzles being respectively arranged in the upper or lower portion thereof.

In the preliminary heating zone, the heating has been normally performed so that the temperature is set to be lower than that of the heating zone or a flow rate of the heated air is set to be smaller. This causes the printed circuit board to be slowly heated so that it is conveyed, without undergoing any heat shook, into the heating zone of the reflow furnace which heats it.

In the heating zone, the soldering has been normally performed by heating it so that the temperature is set to be higher than that of the preliminary heating zone or a flow rate of the heated air is set to be larger. Further, the cooling zone has the same basic configuration as those of the preliminary heating zone and the heating zone. However, the heated air, which is heated by the heater(s), blows in the preliminary heating zone and the heating zone while in this cooling zone, the cooling water pipes and the like are provided instead of the heater(s) so that gas contacts the cooling water pipes to be blown to the board as cooled blast, which causes the board to be cooled.

Patent Document 1 discloses a soldering apparatus in which the heated air is blown from multiple holes. In this soldering apparatus, multiple holes are pierced on a reflow panel and the heated air which has been heated by the heater(s) blows from the multiple holes.

Patent Document 2 discloses a gas-blowing-hole array structure. Due to the gas-blowing-hole array structure, the heating has been uniformly performed by staggering the array along a width direction thereof.

DOCUMENT FOR PRIOR ART

Patent Documents

Patent Document 1: Japanese Patent Application Publication No. H11-307927
Patent Document 2: Japanese Patent Application Publication No. 2004-214535

SUMMARY OF THE INVENTION

Problem to be Solved by the Invention

By the way, in the Patent Document 1, the printed circuit board is conveyed by a conveyer to a predetermined direction. The heated-air-blowing holes are constituted of multiple holes arranged like a lattice along a conveying direction E and a direction that is orthogonal to the conveying direction E. These plural circular holes are arranged with a predetermined pitch along the conveying direction E and the plural circular holes are also arranged with a predetermined pitch along the direction that is orthogonal to the conveying direction E.

Thus, when blowing the heated air from the heated-air-blowing holes in which multiple circular holes are arranged, the printed circuit board is conveyed on a predetermined direction and the heated air is continuously blown to this printed circuit board along the conveying direction. However, there is any portion in which the heated-air-blowing holes do not exist along the direction that is orthogonal to the conveying direction so that the heated air does not blow to a portion of the printed circuit board corresponding to the portion in which the heated-air-blowing holes do not exist. Namely, any variation may occur in the concentration of the heated air blowing to the printed circuit board (there is a difference between the amounts of heated air blowing thereto). Accordingly, there has been a problem such that the temperature is not uniformed in the printed circuit board along the direction that is orthogonal to the conveying direction.

Further, the Patent Document 2 discloses a heating device that performs any uniform heating by staggering the array along a width direction thereof. In this heating device, however, gas-blowing holes have been arranged on the basis of a predetermined regularity, which has been a complex configuration. Therefore, when the reflow furnace is formed so that the heated air blows from top and bottom of each of the preliminary heating zone and the heating zone, it is necessary to arrange heated-air-blowing plates at the top and bottom surfaces, respectively. However, there has been a problem such that since the array structure of the gas-blowing holes arranged in each of the heated-air-blowing plates has been complex, it has not yet beep taken into consideration that the top and bottom heated-air-blowing plates are made common parts.

Further, any gas-intake-ports for circulating blown heated air or cooled air have not yet been taken into consideration in both of the Patent Documents 1 and 2.

Means for Solving the Problems

In order to solve the above problems, a gas-intake-port array structure claimed in Claim 1 is a gas-intake-port array structure of a gas-blowing-holes plate in a soldering apparatus for performing soldering by discharging gas from plural gas-blowing holes arranged in the gas-blowing-holes plate and blowing the gas to a board to be soldered while a conveyed member, which mounts the board, is conveyed. The gas-blowing-holes plate has a predetermined nozzle layout region which is divided into four divided sections. In an arrangement pattern of the gas-blowing holes arranged in the divided section, a first row is formed so that first and second gas-blowing holes are arranged with a predetermined opening width pitch along a direction that is orthogonal to a conveying direction of the conveyed member. Plural other rows are formed with a predetermined row arrangement pitch along the conveying direction with them being parallel to the first row. The first gas-blowing hole in every other row is arranged with a predetermined space along a width direction from the first gas-blowing hole in every other row. The first gas-blowing holes in the first row and other rows have such a configuration that they have different phases from each other on the orthogonal direction. In the divided sections of upper and lower opposite sides relative to a center portion of the nozzle layout region in which the width direction and the conveying direction are orthogonal to each other, a first arrangement pattern of the gas-blowing holes and a second arrangement pattern of the gas-blowing holes, which is an inverse first arrangement pattern thereof are provided so that the arrangement patterns that are arranged on a diagonal line in the nozzle layout region are identical. Gas intake oval ports each having a predetermined opening width for circulating the gas blown from the gas-blowing holes are arranged between the first and second gas-blowing holes and across the first row and the plural other rows having different phases. The opening widths of the oval ports are formed so as to be gradually narrower with increasing distance from the center portion.

The gas-intake-port array structure claimed in Claim 2 is the array structure claimed in Claim 1 wherein the gas-intake oval ports are arranged like V shape and inverse V shape in upper and lower divided sections of the nozzle layout region.

The gas-intake-port array structure claimed in Claim 3 is the array structure claimed in Claim 1 wherein each of the gas-blowing holes includes crisscross opening in a forward end thereof.

A soldering apparatus claimed in Claim 4 blows gas to a board to be soldered by discharging the gas from plural gas-blowing holes arranged in the gas-blowing-holes plate while a conveyed member, which mounts the board, is conveyed. This soldering apparatus for performing the soldering by such blowing is provided with the gas-blowing-holes plate having the gas-intake-port array structure claimed in any of Claims 1 through 3.

Effect of the Invention

According to the gas-intake-port array structure of this invention, there are provided with gas-intake oval ports each having the predetermined opening width for circulating the gas blown from the gas-blowing holes. Each of these oval ports is arranged between the first and second gas-blowing holes and across the first row and the plural other rows having different phases. The opening widths of the oval ports are formed so as to be gradually narrower with increasing distance from the center portion.

Based on such a structure, the intake can be performed with such a gradient that an intake mount in the center portion is the most intake amount corresponding to a blowing amount thereof and gradually decreases (like large, middle and small amounts in this order) in proportion to a distance away from it to a periphery thereof. Therefore, by a synergy of the line symmetry array of the gas-blowing holes and the intake oval ports, it is possible to reduce any temperature fluctuation during conveying time of the conveyed member. This allows the conveyed member such as the printed circuit board, the semiconductor wafer or the like to be very uniformly heated or cooled.

According to the soldering apparatus of this invention, there is provided with the gas-blowing-holes plate having the gas-intake-port array structure of this invention. Thus, it is possible to heat or cool the conveyed member such as the printed circuit board, the semiconductor wafer or the like very uniformly. Therefore, it is possible to provide the printed circuit board with high reliability on which electronic components are soldered and/or a semiconductor wafer with high reliability on which solder electrodes are formed. Further, since the gas-blowing-holes plate can be used as common parts of top and bottom surfaces in the furnace, this avoids manufacturing plural kinds of molds of the gas-blowing-holes plate, which correspond to respective top and bottom surfaces thereof.

MODE FOR IMPLEMENTING THE INVENTION

This invention has an object to present a gas-intake-port array structure and a soldering apparatus, which enable any temperature fluctuation during conveying time of the conveyed member such as a printed circuit board, a semiconductor wafer or the like to be reduced and allow the conveyed member to be very uniformly heated or cooled. Further, it has an object to present a gas-intake-port array structure and a soldering apparatus, which allow the holes plate in which gas-blowing holes and gas-intake-ports are arranged to be used as common parts of top and bottom surfaces in the furnace.

Additionally, in this invention, soldering by blowing any heated gas to the board or cooling the board by blowing any cooled gas to the soldered board will be referred as "soldering processing".

The following will describe the gas-intake-port array structure and the soldering apparatus as embodiments of the invention with reference to the attached drawings. In this embodiment, a case where soldering is performed by blowing any heated gas to the board, as the soldering processing, will be described.

<Nozzle Device 100>

Figure 1:
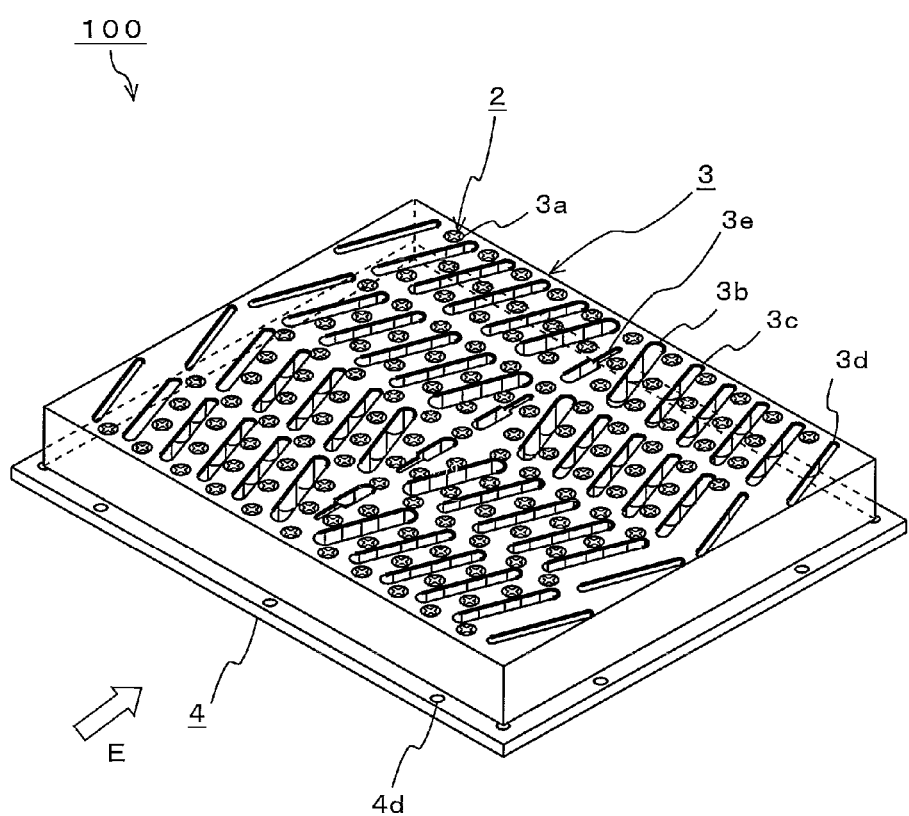
FIG. 1 is a perspective view of a nozzle device 100 according to an embodiment of the invention for showing a configuration example (Part one) thereof.

The nozzle device 100 shown in FIG. 1 is provided with an array structure of gas-blowing holes and gas-intake-ports according to this invention and is applicable to a solder apparatus such as a reflow furnace. In FIG. 1, the nozzle device 100 is composed of plural blowing nozzles 2, one nozzle cover 3, one attachment plate 4, and one fixing plate 5 (see FIG. 2B). The nozzle array has a zigzag array in which there are any different pitches along a vertical direction and a horizontal direction, as a basic regularity.

Figure 2A:
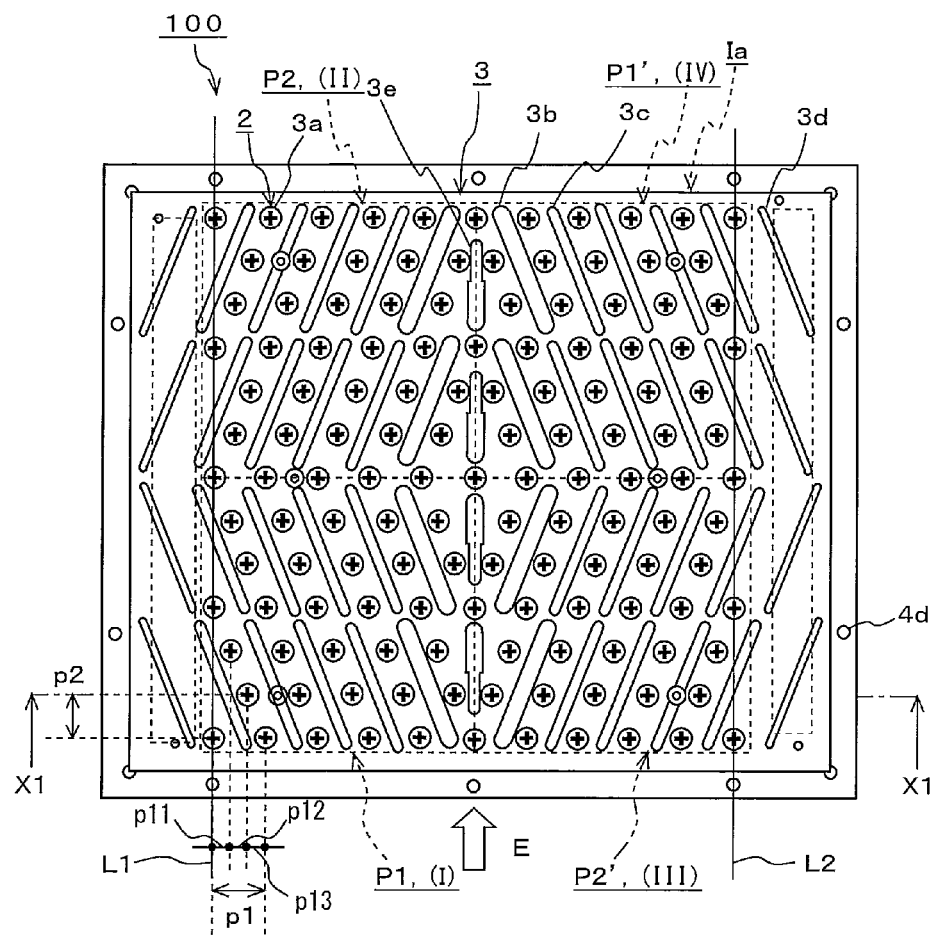
FIG. 2A is a top view of the nozzle device 100 for showing the configuration example (Part two) thereof.
Figure 2B:
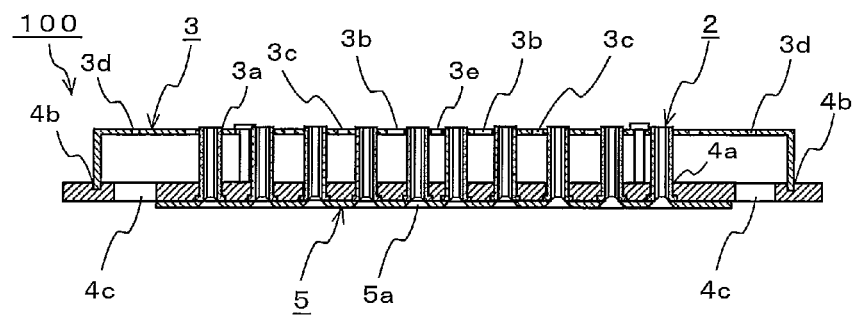
FIG. 2B is a sectional view of the nozzle device 100, taken along the arrow lines X1-X1, for showing the configuration example (Part two) thereof.

In this embodiment, on an upper portion of the fixing plate 5 shown in FIG. 2B, 135 blowing nozzles 2 and one attachment plate 4 are provided as shown in FIG. 2A. Due to an arrangement pattern of the blowing nozzles 2, as shown in FIG. 2A, a nozzle layout region Ia is defined on an upper surface of the fixing plate 4 (the nozzle cover 3) and this nozzle layout region Ia is divided into four divided sections I through IV. The divided sections I through IV are formed by sectioning a quadrilateral into four sections with a cross lattice (see FIG. 6B).

In FIG. 2A, when L1 and L2 are set as conveying guides for a printed circuit board, not shown, a first row is provided so that a first blowing nozzle 2 and a second blowing nozzle 2 are arranged with a predetermined opening width pitch p1 along a direction that is orthogonal to the conveying direction of the printed circuit board. Plural other rows thereof are provided with a predetermined row arrangement pitch p2 along the conveying direction with them being parallel with the first row.

The first blowing nozzle 2 of every other row is arranged so that it has a predetermined space P11, P12 or P13 from the first blowing nozzle 2 of every other row. The arrangement pattern of the blowing nozzles 2 has such an arrangement that the first blowing nozzles 2 of the above-mentioned first row and other rows have different phases from each other along the orthogonal direction (see FIG. 5).

Figure 8:
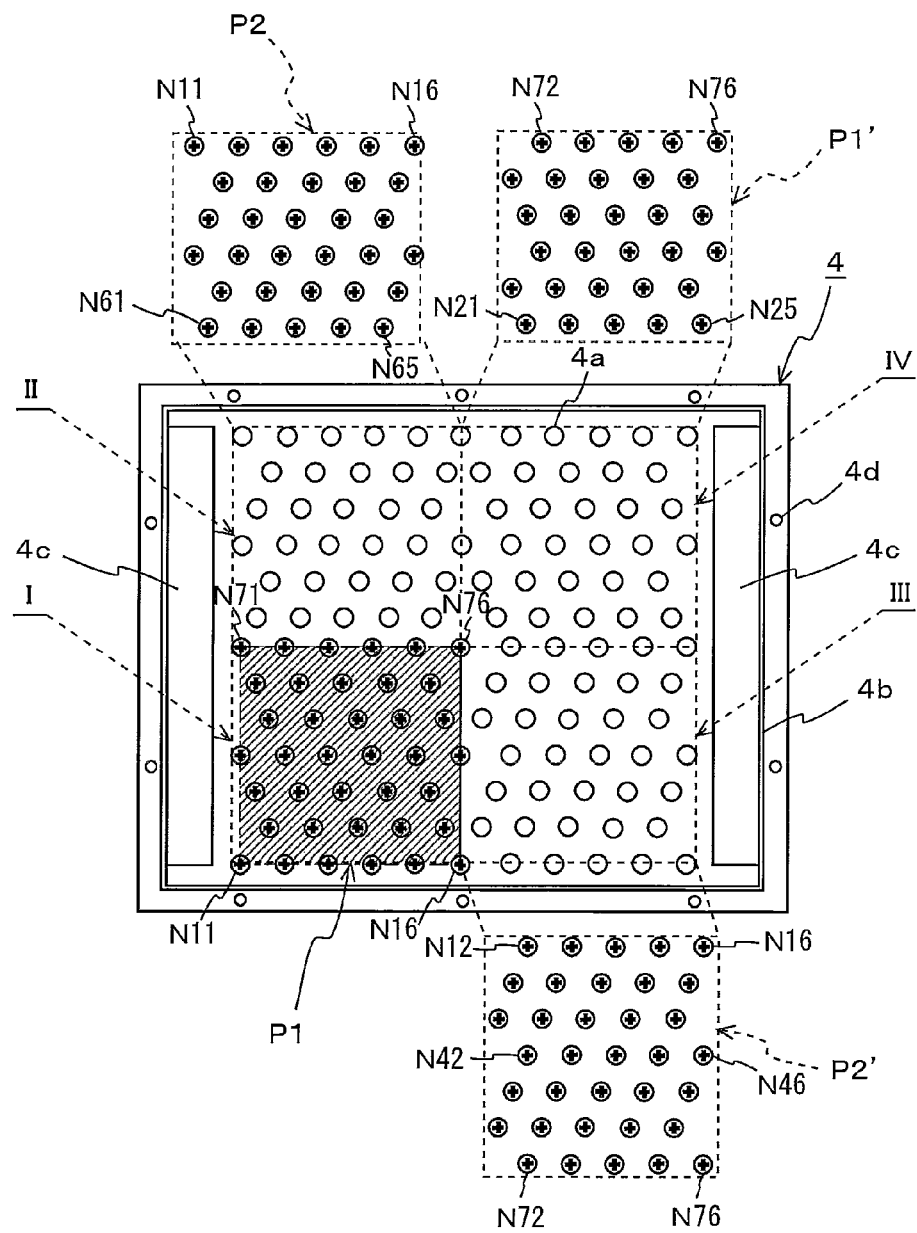
FIG. 8 is a top view for showing an arrangement example of nozzle patterns P1, P1', P2 and P2'.

According to this embodiment, in the right and left as well as upper and lower divided sections I, II, III and IV relative to a center portion of the nozzle layout region Ia in which the conveying direction and a width direction are orthogonal to each other, a first nozzle pattern P1 and a second nozzle pattern P2, which is inverse first nozzle pattern P1, are provided so that the nozzle patterns that stand on a diagonal line in the nozzle layout region Ia are identical (see FIG. 8). Namely, the divided sections I and IV and the divided sections II and III are respectively arranged so as to become point symmetry. Further, in other words, the divided section I and the adjacent divided sections II and III are respectively arranged so as to become line symmetry. Similarly, the divided section II and the adjacent divided sections I and IV are respectively arranged so as to become line symmetry. The divided section II and the adjacent divided sections I and IV are respectively arranged so as to become line symmetry. The divided section IV and the adjacent divided sections II and III are also respectively arranged so as to become line symmetry.

Figure 9A:
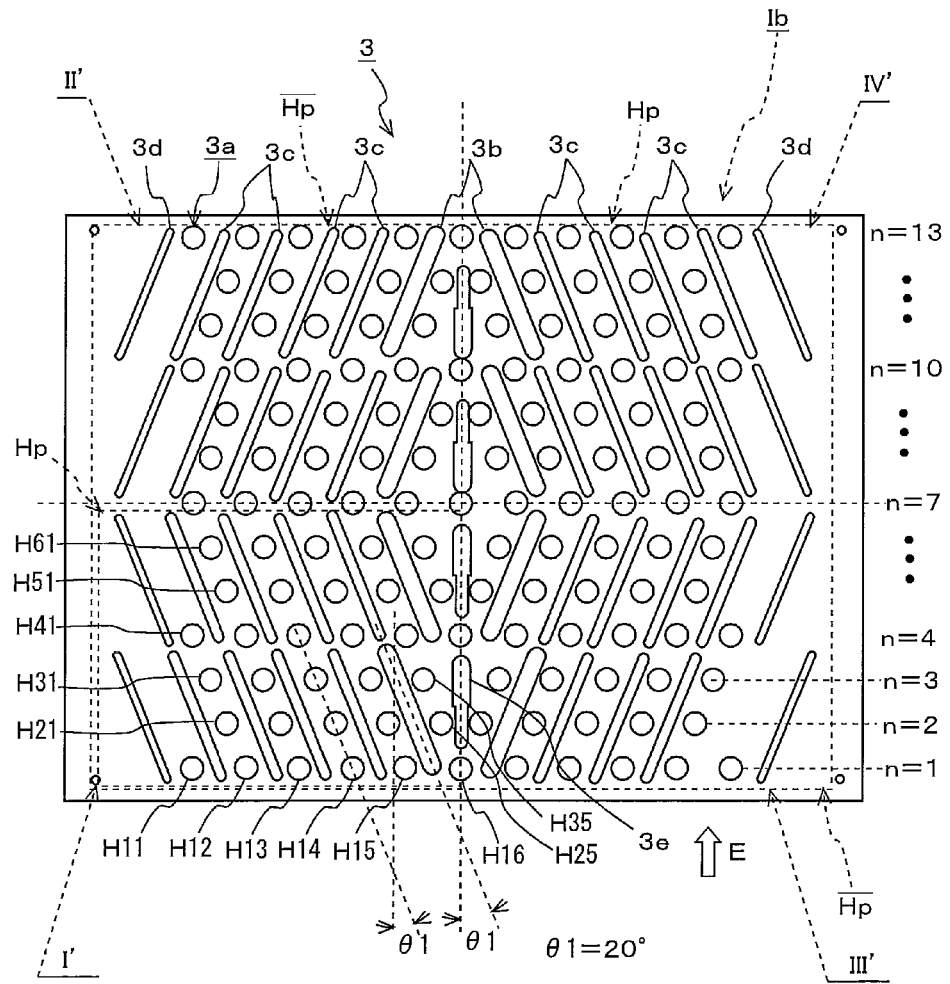
FIG. 9A is a top view of a nozzle cover 3 for showing a configuration example thereof.
Figure 9B:
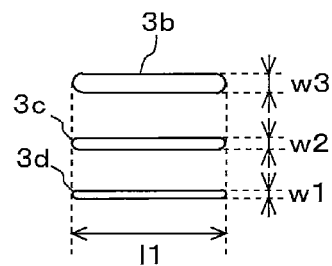
FIG. 9B is a top view of intake ports 3b, 3c and 3d in the nozzle cover 3 for showing a size example thereof.
Figure 9C:
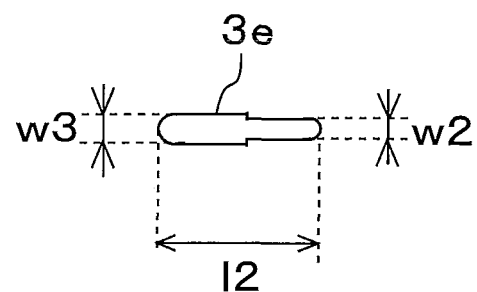
FIG. 9C is a top view of intake port 3e in the nozzle cover 3 for showing a size example thereof.

The array structure of gas-blowing holes and gas-intake-ports according to this invention is, at least, applied to the nozzle cover 3 (see FIGS. 9A through 9C). The array structure of the gas-intake-ports concerning the nozzle patterns P1 and P2 is applied to the attachment plate 4 and the fixing plate 5 (see FIGS. 2B, 6A and 10).

In FIG. 2A, under the 135 blowing nozzles 2, the fixing plate 5 shown in FIG. 2B is provided. In the fixing plate 5, 135 gas-intake-holes 5a reflected by the array positions of the blowing nozzles 2 according to the invention are provided. Each hole 5a is pierced in the fixing plate 5 at a position facing to an inlet of a gas-flowing path 24 corresponding to an outlet 22 of the blowing nozzle 2. The hole 5a is an inlet for supplying any heated gas to the blowing nozzle 2.

The hole 5a is provided for supplying any gas heated by a heater portion to a portion below the outlet 22 so that the heated air blows into the muffle of the reflow furnace through the outlet 22. To the hole 5a, for example, reaming is performed so that it is conically tapered from an outside to an inside. This reaming is performed so that the gas is guided by the tapered portion and is easy to enter into the blowing nozzle 2.

In this embodiment, the 135 blowing nozzles 2 are attached to the attachment plate 4 at an upper portion of the fixing plate 5. In the attachment plate 4, plural holes 4a for attaching the nozzle (see FIG. 8) and a fitting groove 4b for fitting the nozzle cover (see FIGS. 2A, 2B and 5) are provided. As the holes 4a, 135 holes reflected by the array positions of the blowing nozzles 2 according to the invention are provided.

The holes 4a are pierce in the attachment plate 4d with small steps at a lower surface thereof. An opening diameter of a first step in each of the holes 4a has such a length that a projected portion 21a of the blowing nozzle 2 can be fitted thereinto. An opening diameter of a second step in each of the holes 4a has such a length that a main body 21 of the blowing nozzle 2 can be pressed and inserted thereinto.

Each blowing nozzle 2 is fixed at its lower portion side by the fixing plate 5 combined with a lock from the attachment plate 4. Each blowing nozzle 2 is pressed and inserted so that it is passed through the hole 4a of the attachment plate 4 from an upper portion of the fixing plate 5 and stands with projecting from the upper portion of the attachment plate 4. This allows these 135 blowing nozzles 2 to be fixed (supported) by one fixing plate 5 with them being pushed to the attachment plate 4.

The fitting groove 4b is provided on an inner side of the attachment plate 4 and an outer portion of the nozzle cover 3 for covering the attachment plate 4 is fitted into the fitting groove 4b. Such a fitting groove 4b allows the nozzle cover 3 to be assembled to the attachment plate 4 without any divergence therefrom. The holes 4d for attaching a heater portion are also provided on a fringe portion of the attachment plate 4 and the nozzle device 100 is attached to the heater portion by screwing a screw or the like into each of the holes 4a.

The nozzle cover 3 constituting an example of a gas-blowing-holes plate lies over (covers) each of the blowing nozzles 2 at upper portion side thereof. In the nozzle cover 3, 135 holes 3a for the blowing nozzles and 52 intake ports 3b, 3c, 3d and 3e constituting an example of gas-intake oval ports are provided with them being come close to each other. A forward end of the blowing nozzle 2 is fitted into the hole 3a.

The intake ports 3b, 3c and 3d have large, middle and small oval shapes which are different from each other in their opening widths as shown in FIG. 2A and the intake ports 3e has an oval shape with different widths. A shape in which two oval shapes with different widths are linked to each other are referred to as "the oval shape with different widths" in this invention (hereinafter, simply referred to as "the oval shape"). The intake ports 3b, 3c, 3d and 3e draw gas accumulated in the muffle of the reflow furnace and/or gas blown from the blowing nozzles 2, collided with the printed circuit board and reflected thereby.

In this embodiment, the intake ports 3b, 3c, 3d and 3e having predetermined opening widths are arranged between the holes 3a for attaching the blowing nozzles and across the first row and plural other rows having different phases and the opening widths of the intake ports 3b, 3c and 3d are formed to be gradually narrower toward the outside relative to the center portion (see FIGS. 9B and 9C).

Further, intake ports 4c are provided on both sides of the attachment plate 4 as shown in FIG. 2B. The intake ports 4c circulate gas drawn from the intake ports 3b, 3c, 3d and 3e of the nozzle cover 3 to the heater portion and the like.

Figure 3A:
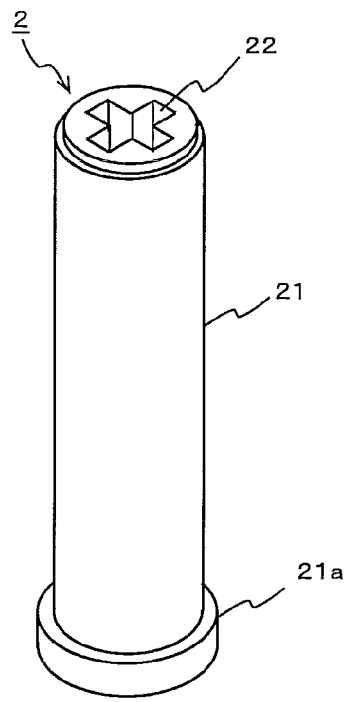
FIG. 3A is a perspective view of a blowing nozzle 2 for showing a configuration example of an outlet 22.
Figure 3B:
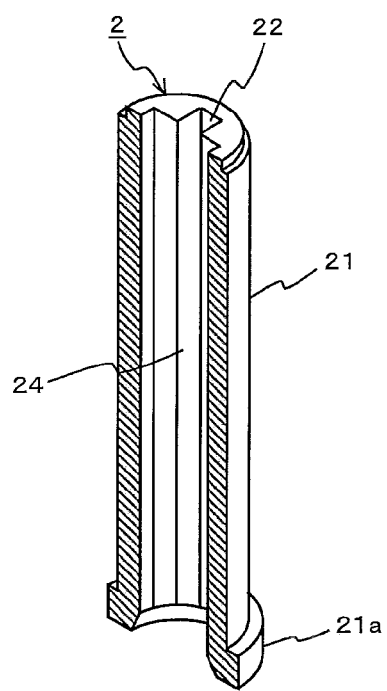
FIG. 3B is a sectional perspective view of the blowing nozzle 2 for showing a configuration example of the outlet 22.
Figure 3C:
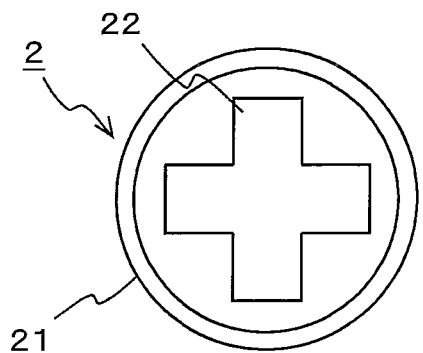
FIG. 3C is a top view of the blowing nozzle 2 for showing a configuration example of the outlet 22.

As the above-mentioned blowing nozzles 2, crisscross nozzles as shown in FIGS. 3A through 3C are used. According to the blowing nozzle 2 shown in FIG. 3A, there is provided with the main body 21 and the outlet 22. The blowing nozzle 2 has the crisscross outlet (opening) 22 at its forward end (namely, crisscross nozzle).

The main body 21 has the projected portion 21a at a low end and is made of metal material such as aluminum, copper or the like having excellent thermal conductivity. This projected portion 21a fits the hole 4a for attaching the nozzle in the attachment plate 4. The gas-flowing path 24 is provided in the main body 21 shown in FIG. 3B. The gas-flowing path 24 flows gas heated by the heater portion or gas cooled by a cooling portion up to the outlet 22 provided at the forward end of the nozzle.

The outlet 22 shown in FIG. 3C has a crisscross. The crisscross is a combination of projected shapes each having line symmetry relative to a center line on a vertical direction and a horizontal direction. The projected shapes respectively are inversion symmetrical figures.

It is to be noted that the printed circuit board, not shown, is conveyed to the conveying direction B as shown as an arrow in FIG. 2A with it being held by the conveying guides L1, L2 shown in FIG. 2A. The outlet 22 provided at the forward end of each of the blowing nozzles 2 blows the gas heated by the heater portion, not shown, (hereinafter, simply referred to as "heated gas"). Each of the blowing nozzles 2 blows the gas, for example, blown from the outlet 22 toward the printed circuit board conveyed to the conveying direction E.

The gas blown from the nozzle device 100 to the printed circuit board and reflected by it may interfere in high-temperature gas blown from the outlet 22 shown in FIG. 3A. The printed circuit board draws heat from the gas reflected by the printed circuit board so that temperature of the gas decreases. When the gas interferes in the gas blown from the outlet 22, temperature of the gas blown from the outlet 22 drops and/or a blowing direction of the gas blown from the outlet 22 is disturbed.

Therefore, the intake ports 3b, 3c, 3d and 3e are provided in the nozzle cover 3 and the gas reflected by the printed circuit board is directly taken into the intake ports 3b, 3c, 3d and 3e. This avoids that the gas reflected by the printed circuit board disturbs the gas blown from the outlet 22.

Figure 4A:
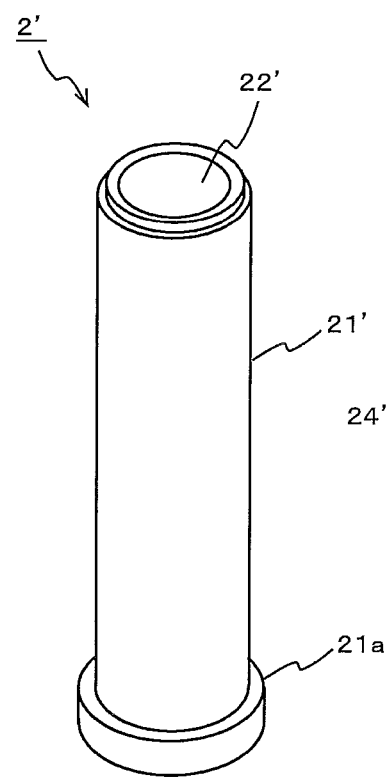
FIG. 4A is a perspective view of a blowing nozzle 2' for showing a configuration example of an outlet 22'.
Figure 4B:
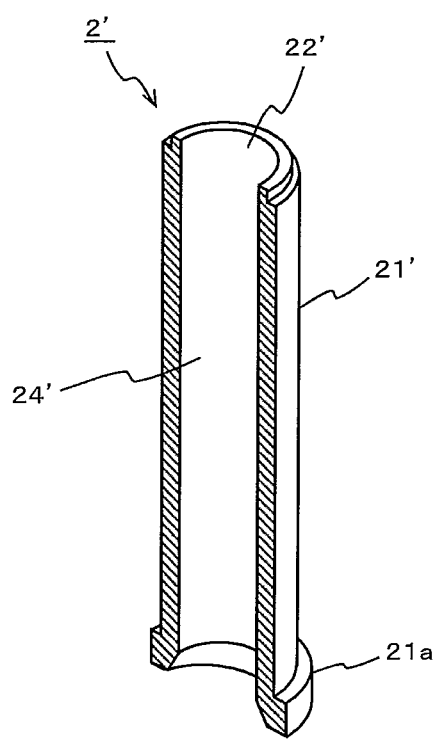
FIG. 4B is a sectional perspective view of the blowing nozzle 2' for showing a configuration example of the outlet 22'.

The gas-blowing holes which are applied to the above-mentioned nozzle device 100 is not limited to the blowing nozzles 2 each having the crisscross outlet 22. A blowing nozzle 2' having circular outlet 22' as shown in FIG. 4A may be used. In the blowing nozzle 2', a main body 21' is also made of the same material as the material of the blowing nozzle 2 and has a projected portion 21a, a gas-flowing path 24' and the like as shown in FIG. 4B.

The blowing nozzles 2 and 2' thus configured blow the gas heated by the heater portion or the gas cooled by the cooling portion from the holes 5a of the fixing plate 5 to the muffle of the reflow furnace through the gas-flowing path 24 and outlet 22, 22' of each of the blowing nozzle 2 and blow the gas toward the printed circuit board. Thus, the nozzle device 100 is configured.

<Arrangement Example of Blowing Nozzle>

The following will first describe an arrangement example of the blowing nozzles 2 with reference to FIGS. 5 through 8 concerning a method of manufacturing the nozzle device 100. The nozzle device 100 shown in FIG. 5 indicates a state thereof in which the nozzle cover 3 is removed and in which 135 blowing nozzles 2 stand on the attachment plate 4.

Figure 6A:
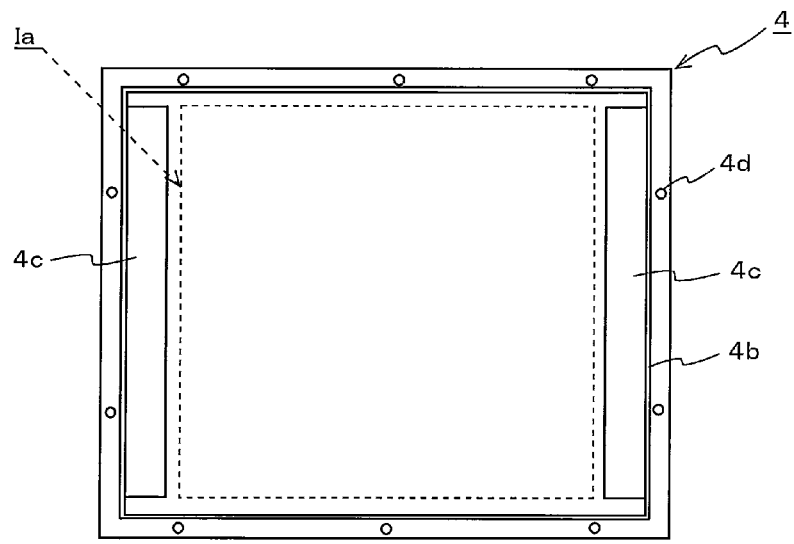
FIG. 6A is a top view of an attachment plate 4 for showing an arrangement example of a nozzle layout region Ia therein.
Figure 6B:
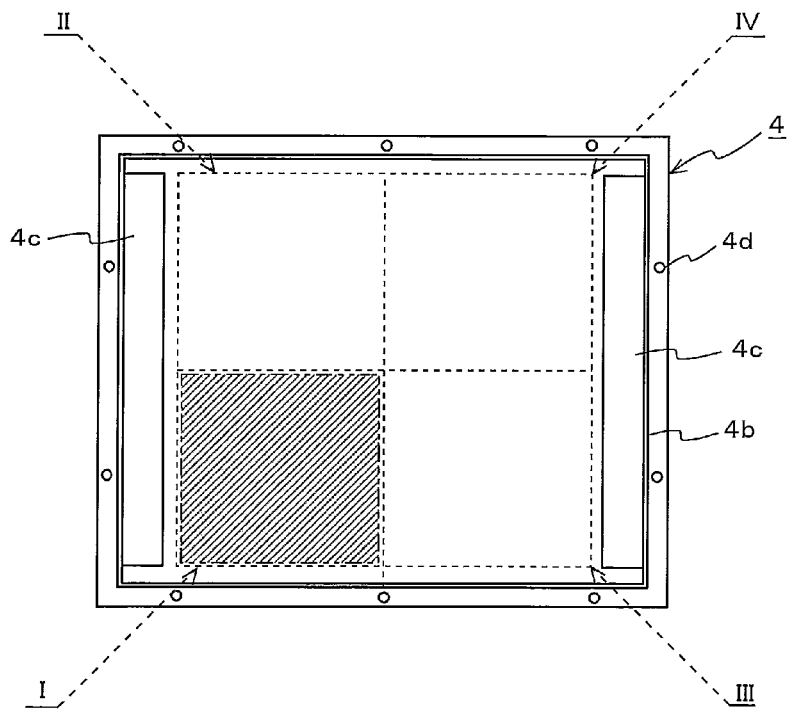
FIG. 6B is a top view of an attachment plate 4 for showing an example of four divided regions I through IV.

The attachment plate 4 has intake ports 4c, 4c on both sides thereof. The rectangular nozzle layout region Ia shown in FIG. 6A is defined between these two intake ports 4c, 4c. This nozzle layout region Ia is divided into four divided sections I through IV as shown in FIG. 6B for convenience. A side of the nozzle layout region Ia is about 300 mm and a side of each of the divided sections I through IV is about 150 mm.

Figure 5:
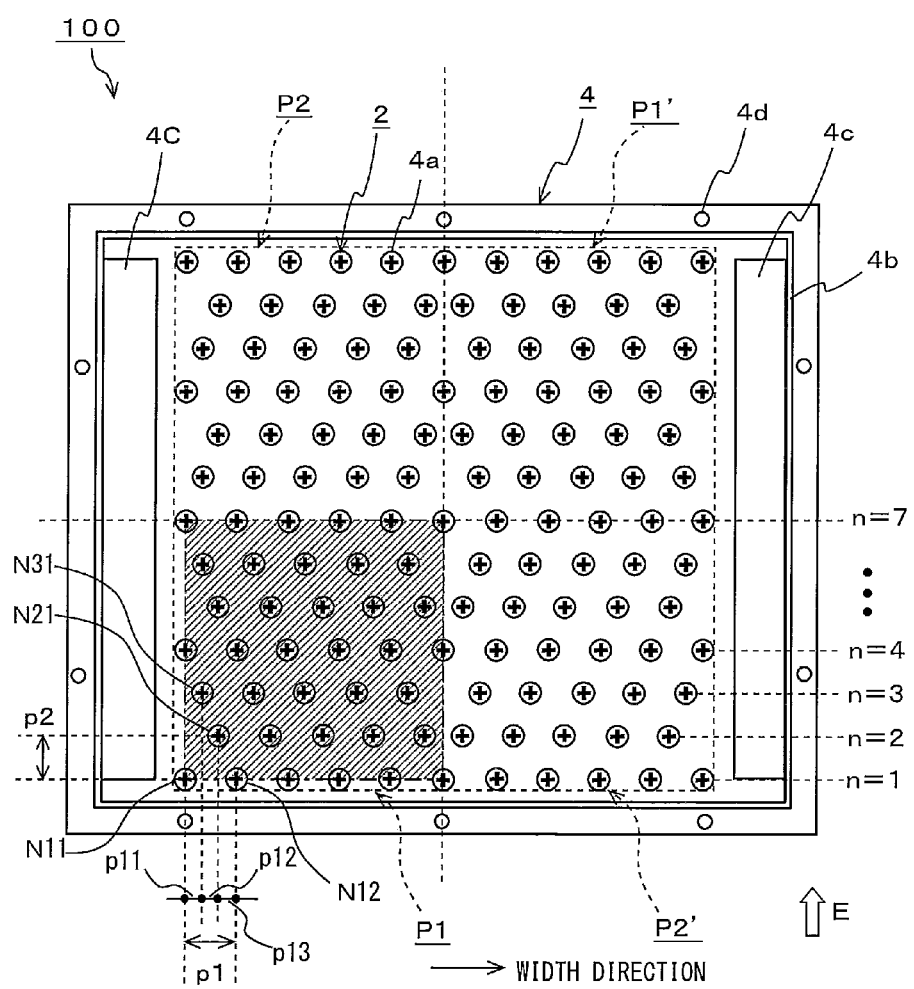
FIG. 5 is a top view of the nozzle device 100 for showing an arrangement example of the blowing nozzles 2.
Figure 7A:
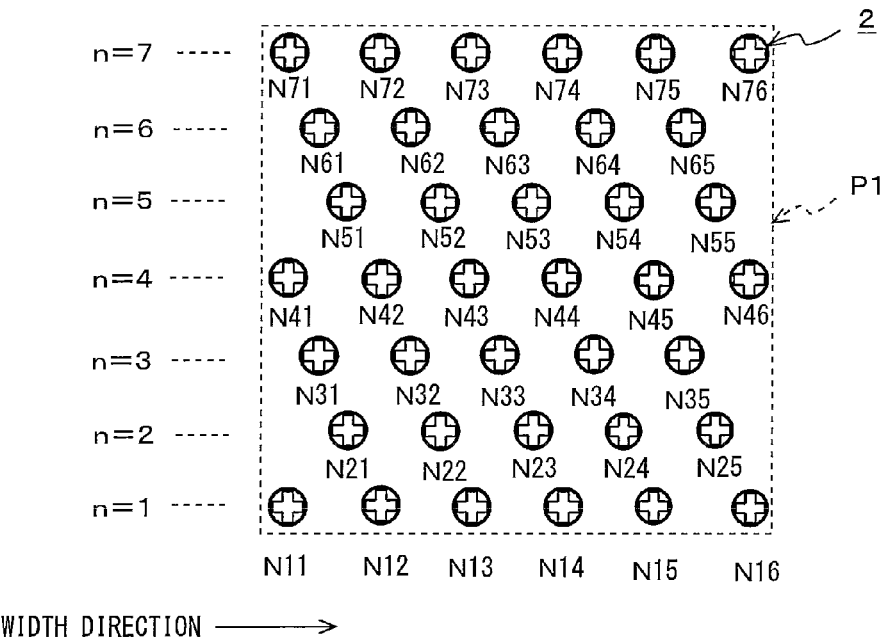
FIG. 7A is a top view of a nozzle pattern P1 for showing a configuration example thereof.

In FIG. 5, in an arrangement pattern of the blowing nozzles 2 provided in one divided section I shown by oblique lines, a first blowing nozzle 2 (nozzle N11) and a second blowing nozzle 2 (nozzle N12) are arranged along a direction that is orthogonal to the conveying direction E of the printed circuit board with a predetermined opening width pitch p1, when the opening width pitch of the blowing nozzles 2 along a width direction of the nozzle device 100 is p1, and they form a first row (n=1) (see FIG. 7A). The opening width pitch p1 is set to be, for example, 30 mm.

Further, when a row arrangement pitch of the blowing nozzles 2 along the conveying direction is p2, plural other rows (n=2 through 7) are formed on the attachment plate 4 with predetermined row arrangement pitch p2 along the conveying direction E while they are parallel with the first row. The row arrangement pitch p2 is set to be, for example, 25 mm.

Additionally, when pitches obtained by dividing an arrangement spaces between the first blowing nozzle 2 (N11) and the second blowing nozzle 2 (N12) into three on the first row (n=1) along the width direction of the attachment plate 4 are width direction spaces p1, p12 and p13, first blowing nozzles 2 (N21, N31, N41 and the like) of respective other rows (n=2, 3) are arranged with the predetermined width direction spaces p11, p12 and p13 from the first blowing nozzles 2 of respective other rows (n=2, 3).

Respective first blowing nozzles 2 (N11, N21, N31 and the like) of the first row and other rows (n=2, 3 through 7) are arranged so that they have different phases on the orthogonal direction. The width direction spaces p11, p12 and p13 are set to be, for example, 10 mm.

FIG. 7A shows a configuration example of a nozzle pattern P1 for arranging 38 blowing nozzles 2 in the divided section I of the nozzle layout region Ia shown in FIG. 6B. The nozzle pattern P1 constitutes an example of first arrangement pattern of the blowing nozzles 2, in which 6 blowing nozzles 2 (hereinafter also referred to as "nozzle N11 through N16") are arranged along the width direction on the first row (n=1).

On the second row (n=2), 5 nozzles N21 through N25 are arranged; On the third row (n=3), 5 nozzles N31 through N35 are also arranged; On the fourth row (n=4), 6 nozzles N41 through N46 are arranged; On the fifth row (n=5), 5 nozzles N51 through N55 are arranged; On the sixth row (n=6), 5 nozzles N61 through N65 are also arranged; and On the seventh row (n=7), 6 nozzles N71 through N76 are respectively arranged.

Figure 7B:
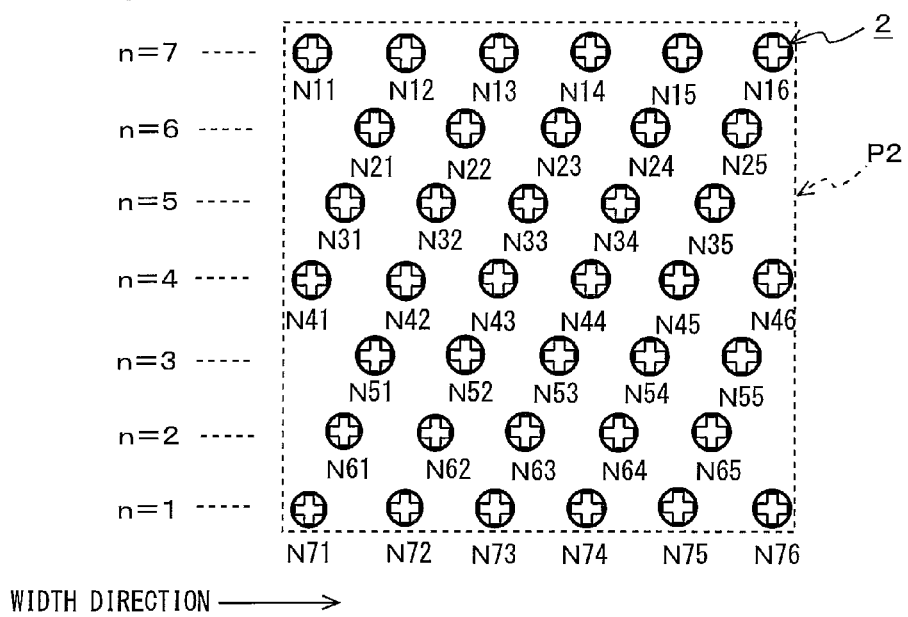
FIG. 7B is a top view of a nozzle pattern P2 for showing a configuration example thereof.

FIG. 7B shows a nozzle pattern P2 constituting an example of a second arrangement pattern of the blowing nozzles 2. The nozzle pattern P2 is formed by reversing the nozzle pattern P1 and on its first row (n=1), 6 nozzles N71 through N76 are respectively arranged. In a case of n=2, 5 nozzles N61 through N65 are arranged; In a case of n=3, 5 nozzles N51 through N55 are also arranged; In a case of n=4, 6 nozzles N41 through N46 are arranged, which is the same as those of non-inverse nozzle pattern; In a case of n=5, 5 nozzles N31 through N35 are arranged; In a case of n=6, 5 nozzles N21 through N25 are also arranged; and In a case of n=7, 6 nozzles N11 through N16 are arranged.

By using these nozzle patterns P1 and P2, 135 blowing nozzles 2 are arranged in the nozzle layout region Ia (the divided sections I through IV). It is to be noted that 17 nozzles in overlapped portions in which the nozzle patterns P1, P2 and the like are connected to each other are omitted (see FIG. 8)

In this embodiment, the nozzle pattern P1 and the nozzle pattern P2 formed by reversing the nozzle pattern P1 are provided so that the arrangement patterns that are arranged on a diagonal line in the nozzle layout region Ia are identical in the divided sections I and II and the divided sections III and IV on upper and lower positions in both sides on the basis of a center portion in which the conveying direction and the width direction are orthogonal to each other in the nozzle layout region Ia of the attachment plate 4 (see FIG. 8).

Due to the arrangement example of the nozzle patterns P1, P2, P1' and P2', shown in FIG. 8, the nozzle pattern P1 is arranged in the divided section I of the nozzle layout region Ia. The nozzle pattern P2 is arranged in the divided section II. The nozzle pattern P2 is an arrangement pattern that is obtained by reversing the nozzle pattern P1 in line symmetry relative to a line passing through the center portion in which the conveying direction and the width direction are orthogonal to each other. 6 nozzles N71 through N76 thereof overlapping the nozzle pattern P1 are omitted.

The nozzle pattern P2' is arranged in the divided section III. The nozzle pattern P2' is an arrangement pattern that is obtained by reversing the nozzle pattern P1 in line symmetry relative to the above-mentioned line. 3 nozzles N11, N41 and N71 thereof overlapping the nozzle pattern P1 are omitted.

The nozzle pattern P1' is arranged in the divided section IV. The nozzle pattern P1' is an arrangement pattern in which the nozzle pattern P1 is not reversed. 6 nozzles N71 through N76 overlapping the nozzle patterns P2' and 2 nozzles N41 and N71 overlapping the nozzle pattern P1' are omitted. Thus, it is possible to arrange the nozzle patterns P1, P2, P1' and P2' on the nozzle layout region Ia and stand 135 blowing nozzles 2 on the attachment plate 4. In this embodiment, on the attachment plate 4, in a case of n=1, 4, 7, 10 and 13, 11 blowing nozzles 2 are arranged on each row and in a case of n=2, 3, 5, 6, 8, 9, 11 and 12, 10 blowing nozzles 2 are arranged on each row.

According to such an array of the blowing nozzles 2 in the nozzle cover 3 of the embodiment, it is possible to realize heating without irregularity by reversing the nozzle patterns P1 and P2 in line symmetry on right and left and upper and lower of the divided sections I through IV and shifting a zigzag array of the blowing nozzles 2 little by little along the width direction that is orthogonal to the conveying direction of a printed circuit board 200 so that the width direction spaces p11, p12 and p13 are included in the opening width pitch p1.

Further, relating to linearly symmetric array of the blowing nozzles 2 in the nozzle patterns P1 and P2, since only such a pattern that a phase is shifted to the width direction in relation to the conveying direction is introduced, it is possible to use the blowing nozzles 2 arrayed in line symmetry along the conveying direction of the printed circuit board up to full of a zone in the reflow furnace. This allows a space between the nozzles of zones to be shortened.

<Nozzle Cover 3>

The following will describe a configuration example of the nozzle cover 3 with reference to FIGS. 9A through 9C. The nozzle cover 3 shown in FIG. 9A is so that the blowing nozzles 2, the attachment plate 4, which are shown in FIG. 5, and the fixing plate 5 are removed from the nozzle device 100 shown in FIGS. 2A and 2B. The nozzle cover 3 has plural holes 3a for attaching the blowing nozzles, and plural intake ports 3b, 3c, 3d and 3e for drawing gas. The intake ports 3b, 3c and 3d constitute an example of the gas-intake oval holes.

In this embodiment, the intake ports 3b, 3c, 3d and 3e having predetermined opening widths w1, w2 and w3 as shown in FIGS. 9B and 9C are arranged between the holes 3a for attaching the nozzle, shown in FIG. 9A and across the first row (n=1) and plural other rows (n=2, 3) having different phases. The opening widths w3, w2 and w1 of the intake ports 3b, 3c and 3d are formed so that they are gradually narrower toward the outside relative to the center portion.

A length of each of the intake ports 3b, 3c and 3d shown in FIG. 9B is l1. The opening width of each of the large oval intake ports 3b is w3. The opening width of each of the middle oval intake ports 3c is w2. The opening width of each of the small oval intake ports 3d is w1. The long oval intake ports 3e shown in FIG. 9C constitute another example of the gas-intake oval holes. Each hole 3e has a length of l2 (l2<l1). Broder opening width of each of the intake ports 3e is, for example, w3 and narrower opening width of each of the intake ports 3e is, for example, w2.

Since the arrangement pattern of the holes 3a in the nozzle cover 3 is similar to the arrangement pattern of the blowing nozzles 2, which has been described in FIGS. 5 through 8, its description will be omitted. Here, when setting a line that is parallel with the conveying direction E, if an angle formed by this line and a line connecting plural holes 3a for attaching the nozzles arranged across the first row (n=1) and second row (n=2) and the third row (n=3), which has different phases, is θ1, the angle θ1 is set to be about 20 degrees.

Ib shown in the drawing indicates whole region (hereinafter, referred to as "intake ports layout region") in which the intake ports 3b, 3c, 3d and 3e are arranged. In this embodiment, the intake ports layout region Ib is also divided into four divided sections I' through IV'. The divided sections I' through IV' of the nozzle cover 3 are set to be broader than the divided sections I through IV of the attachment plate 4. This broader region is because the gas is easy to be drawn by including a region of the intake ports 4c of the attachment plate 4 in the divided regions I' through IV'.

According to the arrangement pattern of the intake ports 3b, 3c, 3d and 3e provided on one divided section I', which is enclosed by dotted lines, in FIG. 9A, 2 large intake holds 3b, 8 middle intake ports 3c and 2 small intake ports 4d are arranged. A vertically divided half of each of the two intake ports 3e is arranged.

Here, when setting respective nozzle holes corresponding to the blowing nozzles N11 through N16, N21 through N25, N31 through N35, N41 through N46, N51 through N55 and N61 through N65, which are shown in FIG. 5, to be the nozzles H11 through H16 (FIG. 9A), H21 through H25 (not shown), H31 through H35 (not shown), H41 through H46 (not shown), H51 through H55 (not shown) and H61 through H65 (not shown) (However, H21, H25, H31, H41, H51 and H61 are shown in FIG. 9A), the first large intake port 3b has the above-mentioned angle of θ1=20 degrees and is arranged between the nozzle holes H15 and H16 on n=1, between the nozzle holes H24 and H25 on n=2 and between the nozzle holes H34 and H35 on n=3.

The first middle intake port 3c has similar angle and is arranged between the nozzle holes H14 and H15 on n=1, between the nozzle holes H23 and H24 on n=2 and between the nozzle holes H33 and H34 on n=3. The second middle intake port 3c has similar angle and is arranged between the nozzle holes H13 and H14 on n=1, between the nozzle holes H22 and H23 on n=2 and between the nozzle holes H32 and H33 on n=3.

The third middle intake port 3c has a similar angle and is arranged between the nozzle holes H12 and H13 on n=1, between the nozzle holes H21 and H22 on n=2 and between the nozzle holes H31 and H33 on n=3. The fourth middle intake port 3c has similar angle and is arranged between the nozzle holes H11 and H12 on n=1. The first small intake port 3d is arranged in parallel with the fourth middle intake port 3c with a predetermined space therefrom.

In the rows n=4 through 6 on the conveying direction E, the second large intake port 3b has the above-mentioned angle of θ1=20 degrees and is arranged between the nozzle holes H45 and H46 on n=4, between the nozzle holes H54 and H55 on n=5 and between the nozzle holes H64 and H65 on n=6. The fifth middle intake port 3c has similar angle and is arranged between the nozzle holes H44 and H45 on n=4, between the nozzle holes H53 and H54 N53 and N51 on n=5 and between the nozzle holes H63 and H64 on n=6.

The sixth middle intake port 3c has similar angle and is arranged between the nozzle holes H43 and H44 on n=4, between the nozzle holes H52 and H53 on n=5 and between the nozzle holes H62 and H63 on n=6. The seventh middle intake port 3c has similar angle and is arranged between the nozzle holes H42 and H43 on n=4, between the nozzle holes H51 and H52 on n=5 and between the nozzle holes H61 and H62 on n=6.

The eighth middle intake port 3c has similar angle and is arranged between the nozzle holes H41 and H42 on n=4. The second small intake port 3d is arranged in parallel with the eighth middle intake port 3c with a predetermined space therefrom. Thus, 2 large intake ports 3b, 8 middle intake ports 3c and 2 small intake ports 3d are arranged in the divided section I'. This arrangement pattern of these intake ports 3b, 3c, 3d and 3e is regarded as non-inverse intake ports pattern HP.

In this embodiment, inverse intake ports pattern HP bar is arranged in the divided section II' and the inverse intake ports pattern HP bar is also arranged in the divided section III'. Non-inverse intake ports pattern HP is arranged in the divided section IV'. 2 intake ports 3e are respectively arranged between the nozzle holes H16 and H46 and between H46 and H76, which holes are arranged vertically on a center line in parallel with the conveying direction E.

Here, in the divided sections I' and II' relative to the center portion in which the conveying direction and the width direction are orthogonal to each other in intake ports layout region Ib of the nozzle cover 3, two intake ports patterns HP and HP bar, which are vertically adjacent to each other, are line symmetry. In the divided sections III' and IV', two intake ports patterns HP and HP bar, which are vertically adjacent to each other, are line symmetry.

Moreover, in the divided sections I' and III', two intake ports patterns HP and HP bar, which are horizontally adjacent to each other at location halving each of the intake ports 3e, are line symmetry. In the divided sections II' and IV', two intake ports patterns HP and HP bar, which are horizontally adjacent to each other at location halving each of the intake ports 3e, are also line symmetry. Thus, the nozzle cover 3 having 52 intake ports 3b, 3c, 3d and 3e is configured.

According to the abovementioned nozzle cover 3, since the intake ports 3b, 3c, 3d and 3e is provided, it is possible to suppress interfering the gas reflected by the printed circuit board with the gas blown from the blowing outlets 22. By the nozzle device 100, it is possible to decrease any interference of the gas reflected by the printed circuit board with the gas blown from the blowing outlets 22 of the blowing nozzles 2, so that it is possible to suppress dropping the temperature of the gas blown from these outlets 22 or disturbing a blowing direction of the gas.

<Assembling Example of Nozzle Device 100>

Figure 10:
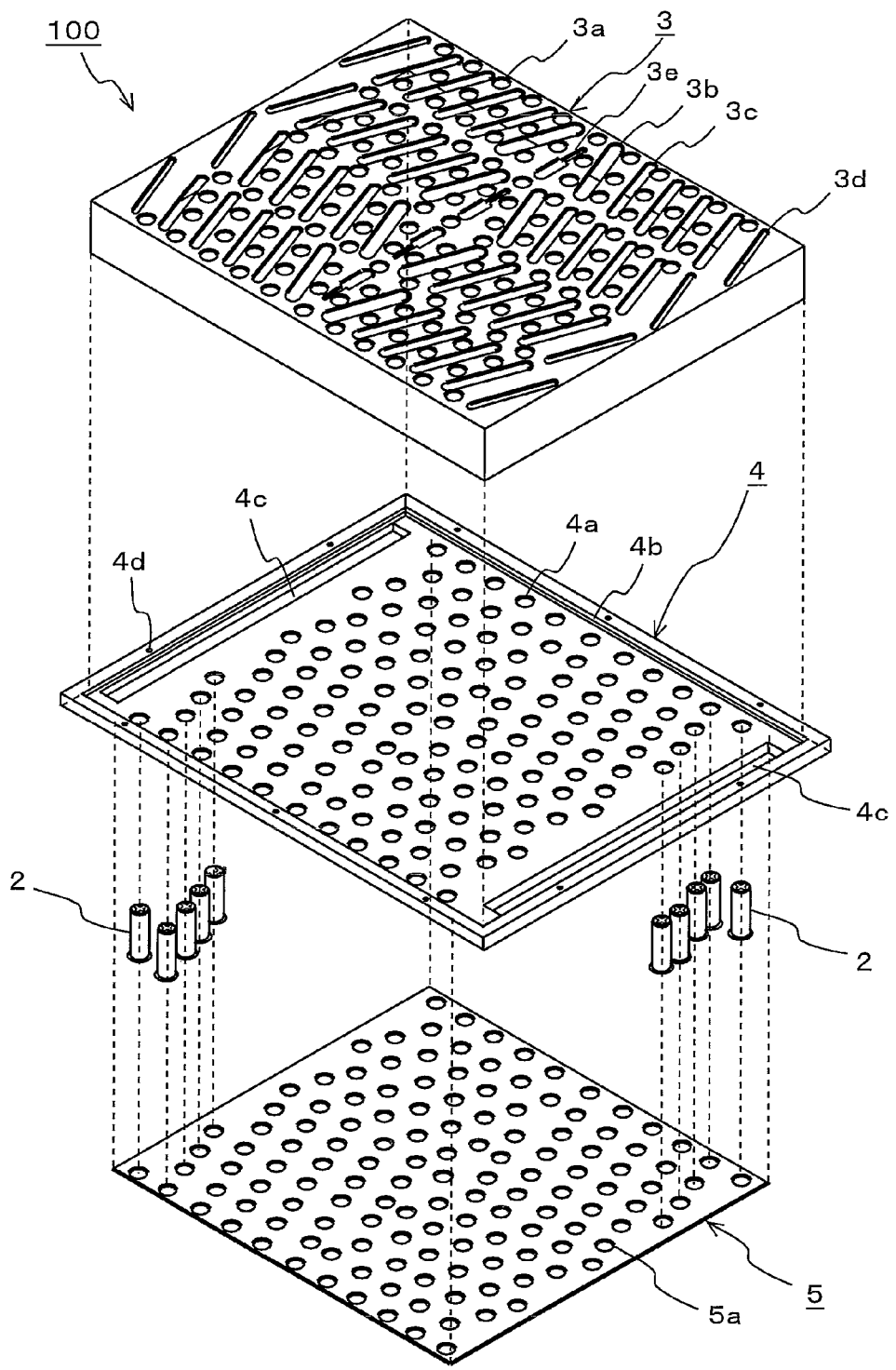
FIG. 10 is a perspective view of the nozzle device 100 for showing an assembling example thereof.

The following will describe an assembling example of the nozzle device 100 with reference to FIG. 10. In this embodiment, a case where 135 blowing nozzles 2 (see FIGS. 3A through 3C), one attachment plate 4 (see FIGS. 6A and 6B), one fixing plate 5 and one nozzle cover 3 (see FIG. 9A) are prepared and they are assembled into the nozzle device 100 shown in FIG. 1 is assumed.

First, the 135 blowing nozzles 2 are prepared. As the blowing nozzles 2, the nozzles each having crisscross outlet 22 of the main body 21 shown in FIG. 3A are used. Each blowing nozzle 2 may be made by means of any metal mold casting such that the main body 21, the outlet and the gas-flowing path 24 are made at the same time. In FIG. 10, a part of the blowing nozzles 2 will be omitted in order to make it to see the drawing.

When the blowing nozzles 2 are prepared, the attachment plate 4 is next prepared. As the attachment plate 4, the metal plate having a predetermined thickness to which cutting and drilling are performed is used. As the metal plate, in this embodiment, aluminum is used but copper, brass and the like may be used. In the attachment plate 4, a surface of the metal plate is concavely cut by, for example, electrical discharge machining or the like to form the fitting groove 4b in order to define a screwing region like a frame on a boundary thereof. An interior of the fitting groove 4b is holes-forming region. The holes-forming region is a region reflected by the intake ports layout region Ib of the nozzle cover 3.

Further, on opposite sides of the holes-forming region, the intake ports 4c, 4c are respectively formed and the holes 4a each for attaching the nozzle are formed in the nozzles layout region Ia between the intake ports 4c, 4c. The arrangement pattern of the holes 4a is exactly described as the arrangement pattern of the blowing nozzles 2 shown in FIGS. 5, 6A and 6B. For example, when applying the blowing nozzles 2 to the holes 4a by change in the arrangement pattern of the blowing nozzles 2 provided in one divided section I shown by oblique lines in FIG. 5, if the opening width pitch of the hole 4a along the width direction is p1, the first hole 4a (corresponding to the nozzle hole H11) and the second hole 4a (corresponding to the nozzle hole H12) are arranged with the predetermined opening width pitch p1 along the width direction that is orthogonal to the conveying direction E of the printed circuit board to form the first row (n=1) (see FIG. 5). The opening width pitch p1 is set to be, for example, 30 mm.

Further, if the row arrangement pitch of the hole 4a along the conveying direction is p2, plural other rows (n=2 through 7) are formed along the conveying direction E on the attachment plate 4 with the predetermined row arrangement pitch p2 in parallel with the first row. The row arrangement pitch p2 is set to be, for example, 25 mm.

Additionally, when pitches formed by dividing the arrangement space of the first hole 4a (H11) of the first row (n=1) and the second hole 4a (H12) thereof along the width direction of the attachment plate 4 into three are width direction spaces p11, p12 and p13, the first holes 4a (H21, H31, H41 and the like) of respective other rows (n=2, 3) are arranged with the predetermined width direction space p11, p12 or p13 from the first holes 4a of the respective other rows (n=2, 3).

In this embodiment, 2 intake ports 4c, 4c and 135 holes 4a are pierced (opened) by, for example, punching or the like by a pressing machine. The holes 4a are pieced so that each hole 4a is smaller than an outer circumference of the projected portion 21a in order to retain and fix the projected portion 21a provided at a rear end of the blowing nozzle 2. The hole 4a may also have a space through which the blowing nozzle 2 can be inserted into the hole 4a like push-in.

Since the blowing nozzles 2 are previously fixed on the attachment plate 4 when assembling the nozzle device 100, work when assembling the fixing plate 5, which will be described later, with the attachment plate 4 is made easy. Further, the holes 4d for attaching a heater portion are formed on the frame portion on the boundary of the attachment plate 4. The holes 4d are pierced by a drill or the like.

When the blowing nozzles 2 and the attachment plate 4 are prepared, the 135 blowing nozzles 2 may be inserted into 135 holes 4a to be previously assembled. An upper side of the crisscross outlet 22 of the blowing nozzle 2 is inserted into the corresponding hole 4a from one surface side of the attachment plate 4 and it is put in place so that the main body 21 is inserted thereinto. In this moment, the projected portion 21a of the blowing nozzle 2 contacts one surface side of the hole 4a. Other blowing nozzles 2 are similarly put in place. Accordingly, the attachment plate 4 with nozzles, in which 135 blowing nozzles 4 stand from the other surface side of the attachment plate 4, is previously assembled.

When the attachment plate 4 with nozzles is prepared, the fixing plate 5 is next prepared. As the fixing plate 5, the metal plate having a predetermined thickness to which cutting and drilling are performed is used. As the metal plate, in this embodiment, aluminum is used but copper, brass and the like may be used. In the fixing plate 5, the holes-forming region is defined. This holes-forming region is a region reflected by the nozzle layout region Ia of the nozzle cover 3. When the holes-forming region is defined, the gas-intake-holes 5a are pierced.

The holes 5a may be pierced by a drill while they are patterned on the fixing plate 5 with them being synchronized with the holes 4a for attaching the nozzles. In this moment, the holes 5a may be conically tapered from outside thereof to inside thereof (by a reamer). This allows the gas to enter into the blowing nozzles 2 by guiding the gas through the tapered portion. Of course, the holes 5a may be pierced by the drill and be pierced by punching the metal plate with a press metal die.

When the fixing plate 5 is prepared, the previously assembled attachment plate 4 with nozzles is assembled. In this moment, the holes 5a of the fixing plate 5 are respectively aligned to the gas-flowing paths 24 of the blowing nozzles 2. The attachment plate 4 and the fixing plate 5 are fixed by respectively turning screws into tapped holes, not shown, of the fixing plate 5 with them supporting the blowing nozzles 2. This allows the blowing nozzles 2, the attachment plate 4 and the fixing plate 5 to be integrated, thereby obtaining the attachment plate 4 with nozzles as shown in FIG. 5.

Next, when the attachment plate 4 with nozzles is assembled, the nozzle cover 3 shown in FIGS. 9A through 9C is prepared. The nozzle cover 3 may use a flat box body having a shape with an open surface, a bottom surface and four side surfaces. The flat box body is formed by, for example, cutting one metal plate to form the bottom and four sides and folding the four sides relative to the bottom. The nozzle cover 3 is used so that the bottom surface of the flat box body faces upward and the open surface thereof faces downward.

The nozzle cover 3 is formed by piercing 135 holes 3a, 52 intake ports 3b, 3c, 3d and 3e in the flat box body. The holes 3a are pierced so that each of them has a diameter which is smaller than an outer diameter of the main body 21 and larger than the outlet 22, in order to allow each of them to be enclosed around the outlet 22 and fitted.

The intake ports 3b, 3c and 3d are formed (slit) so as to be large, middle and small oval shapes and the intake ports 3e is formed so as to be long oval shape. The intake ports 3b, 3c, 3d and 3e are pierced near the holes 3a in order to allow them to be positioned near the blowing nozzles 2. The intake ports 3b, 3c, 3d and 3e may be formed by piercing the flat box body by, for example, punching it with a press mold to be large, middle and small oval shapes and long oval shape. The holes 3a may be formed by piercing it with a drill or the like.

In this embodiment, the intake ports 3b, 3c, 3d and 3e having the predetermined open widths w1, w2 and w3 are arranged between the first row (n=1) blowing nozzles 2, between the second row (n=2) blowing nozzles 2 and the third row blowing nozzles 2 as well as across the first row and plural other rows (n=2, 3) having different phases in order to circulate the gas blown from the blowing holes 2. The open widths w3, w2 and w1 of the intake ports 3b, 3c and 3d are formed so that they are gradually narrower with increasing distance from the center portion.

The intake ports 3b, 3c and 3d are arranged to be V-shaped relative to the lower intake ports 3e in right and left divided sections I' and III' and are arranged to be reversed V-shaped relative to the upper intake ports 3e in right and left divided sections II' and IV'. The manufacture methods of the above-mentioned nozzle cover 3, attachment plate 4 and fixing plate 5 are suitably changeable.

When the nozzle cover 3 is prepared, the nozzle cover 3 is put on the attachment plate 4 with nozzles, which has been integrated with the fixing plate 5. In this embodiment, one nozzle cover 3 having 135 holes 3a and 52 intake ports 3b, 3c, 3d and 3e covers 135 blowing nozzles 2.

In this moment, by fitting an outer circumference of the nozzle cover 3 into the fitting groove 4b formed in the attachment plate 4, it is possible for the nozzle cover 3 to be fit into the attachment plate 4 without any gap. The nozzle cover 3 and the attachment plate 4 are fixed by means of a well-known method such as screwing. This allows the blowing nozzles 2, the nozzle cover 3 and the attachment plate 4 to be integrated, so that the nozzle device 100 can be easily assembled.

By the way, the attachment plate 4 with nozzles, which has been integrated with the fixing plate 5, and the nozzle cover 3 may be jointed by welding. Further, each blowing nozzles 2 may screw the nozzle cover 3 directly and the blowing nozzles 2 are fixed into the nozzle cover 3. According to this fixing method, the attachment plate 4 may be omitted. The assembling method of the nozzle device 100 is not limited to that of this embodiment: It is suitably changeable.

Thus, according to such an array structure of the nozzle cover 3 as the embodiment, the intake ports 3b, 3c, 3d and 3e having the predetermined open widths w1, w2 and w3 are provided in order to circulate the gas blown from the blowing holes 2. The intake ports 3b, 3c and 3d are arranged between the first row blowing nozzles 2 and between the other row blowing nozzles 2 as well as across the first row and plural other rows having different phases. The open widths w3, w2 and w1 of the intake ports 3b, 3c and 3d are formed so that they are gradually narrower with increasing distance from the center portion.

By such a structure, it is possible to set the gradient of the intake amount such that the center portion has the most intake amount corresponding to an amount of blowing gas and the intake amount is gradually decreased (from large amount to small amount through middle amount) as it goes away from it to the periphery. Therefore, by a synergy of the line symmetry array of the blowing holes 2 and the intake ports 3b, 3c, 3d and 3e, it is possible to reduce any temperature fluctuation during conveying time of the conveyed printed circuit board 200. This allows the printed circuit board 200, the semiconductor wafer or the like to be very uniformly heated.

<Reflow Furnace 300>

Figure 11:
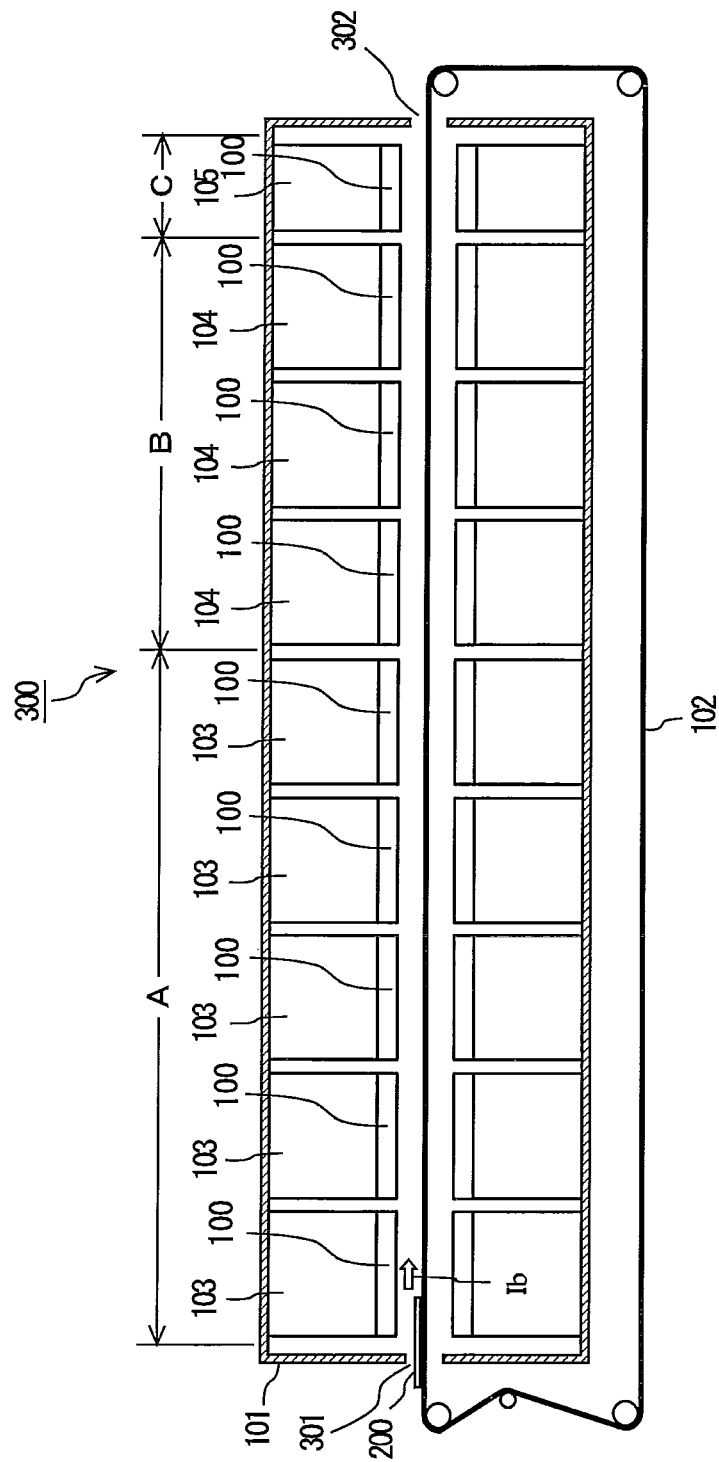
FIG. 11 is a sectional view of a reflow furnace 300 for showing a configuration example thereof.

The following will describe a configuration example of the reflow furnace 300 with reference to FIG. 11. The reflow furnace 300 shown in FIG. 11 constitutes a soldering apparatus and performs at least any one of soldering electronic components and forming electrodes for soldering the electronic components by fusing the solder by discharging heated gas from plural blowing nozzles 2 arranged in the nozzle plate 3 and blowing heated air to the solder paste applied to the board while the printed circuit board to be soldered is conveyed.

The reflow furnace 300 is composed of a main body portion 101 and a conveyer 102 for conveying the printed circuit board 200. There are three zones of a preliminary heating zone A, a heating zone B and a cooling zone C in the main body portion 101. In the reflow furnace 300, the printed circuit board 200 to be soldered is conveyed by the conveyer 102 in order of the preliminary heating zone A, the heating zone B and the cooling zone C. It is to be noted that the printed circuit board 200 is conveyed by the conveyer 102 along the conveying direction E, which is shown by an arrow in FIG. 2A with it being held by the conveying guides L1 and L2 shown in FIG. 2A.

The preliminary heating zone A is a region for slowly heating the printed circuit board 200 and electronic components mounted on this printed circuit board 200 to inure itself to heat and for volatilizing and dispersing a solvent in the solder paste. The preliminary heating zone A is set to be about 150 degrees C. through 180 degrees C. for lead-free past, which is different in solder components and species of the printed circuit board 200. As the solder paste, a high-purity material or low α-line solder (LAS) material is used.

The heating zone B is set to have higher temperature (about 240 degrees C. for lead-free paste) than that of the preliminary heating zone A and is a region for performing soldering by fusing solder powder in the solder paste. The cooling zone C is a region for cooling the soldered printed circuit board 200.

In the preliminary heating zone A, heater portions 103 are arranged every 5 zones at upper and lower positions of the conveyer 102 and the nozzle device 100 according to this invention is mounted on each heater portion 103. In the heating zone B, heater portions 104 are arranged every 3 zones at upper and lower positions of the conveyer 102 and the nozzle device 100 according to this invention is mounted on each heater portion 104.

Each of the heater portions 103, 104 is composed of an electric wire heater, a fan, a fan motor for rotating the fan, which are not shown, and the like. The heater portions 103, 104 heat the gas (for example, air or inert gas such as nitrogen gas) by the electric wire heaters, drive the fan motors to rotate the fans and blow the heated gas as heated air into the reflow furnace 300. A flow rate of the heated air blown from each of the heater portions 103, 104 is controlled by a rotation speed of each of the fan motors. Normally, the temperature of the heater portions 104 is set to be higher than the temperature of the heater portions 103.

In the cooling zone C, cooling portions 105 are arranged every one zone at upper and lower positions of the conveyer 102 and the nozzle device 100 according to this invention is mounted on each cooling portion 105. The cooling portion 105 is composed of any cooling mechanism of cooling water pipes and the like, a fan, a fan motor for rotating the fan, which are not shown, and the like.

The cooling zone C cools the cooling water pipes by flowing water in the pipes and contacting the gas to these pipes to cool the gas. The cooling portions 105 drive the fan motors to rotate the fans, blow the gas cooled by the pipes as cooled air from the nozzle device 100, and cool the soldered printed circuit board 200.

It is to be noted that the cooling mechanism may be composed of only air cooling by means of fans excluding cooling water pipes. Moreover, zone numbers of each of the preliminary heating zone A and the heating zone B, heater number of the heater portions 103, 104 and the heater arrangement of upper and lower positions are not limited to those of this embodiment: They are suitably changeable.

Figure 12:
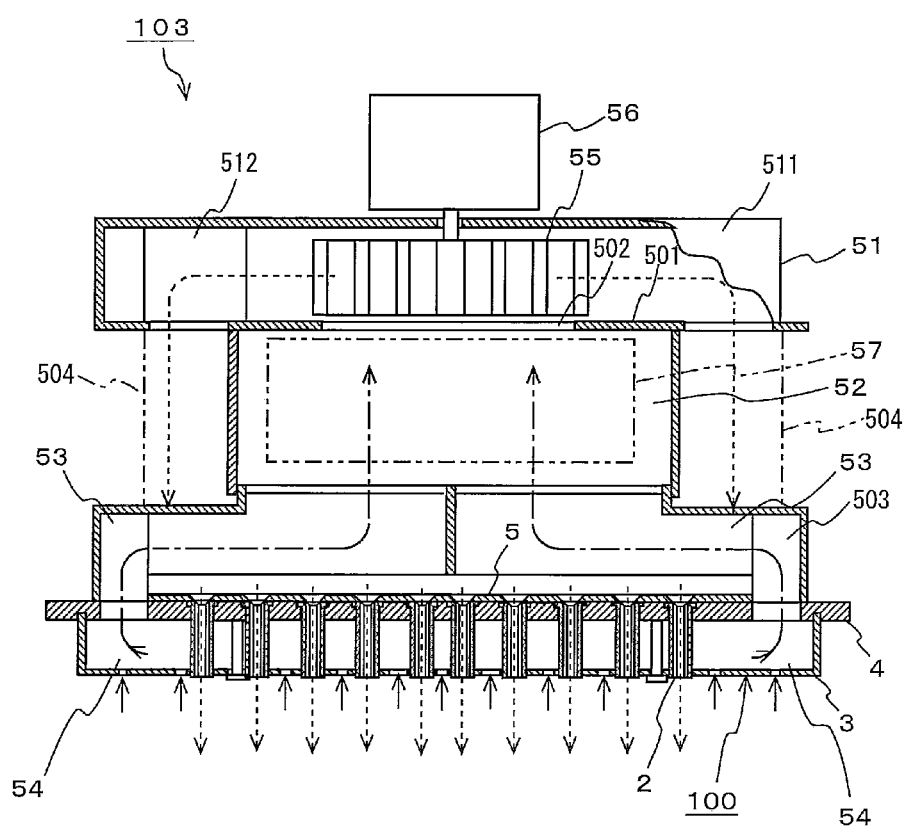
FIG. 12 is a sectional view of a heating portion 103 for showing a configuration example thereof.
Figure 13:
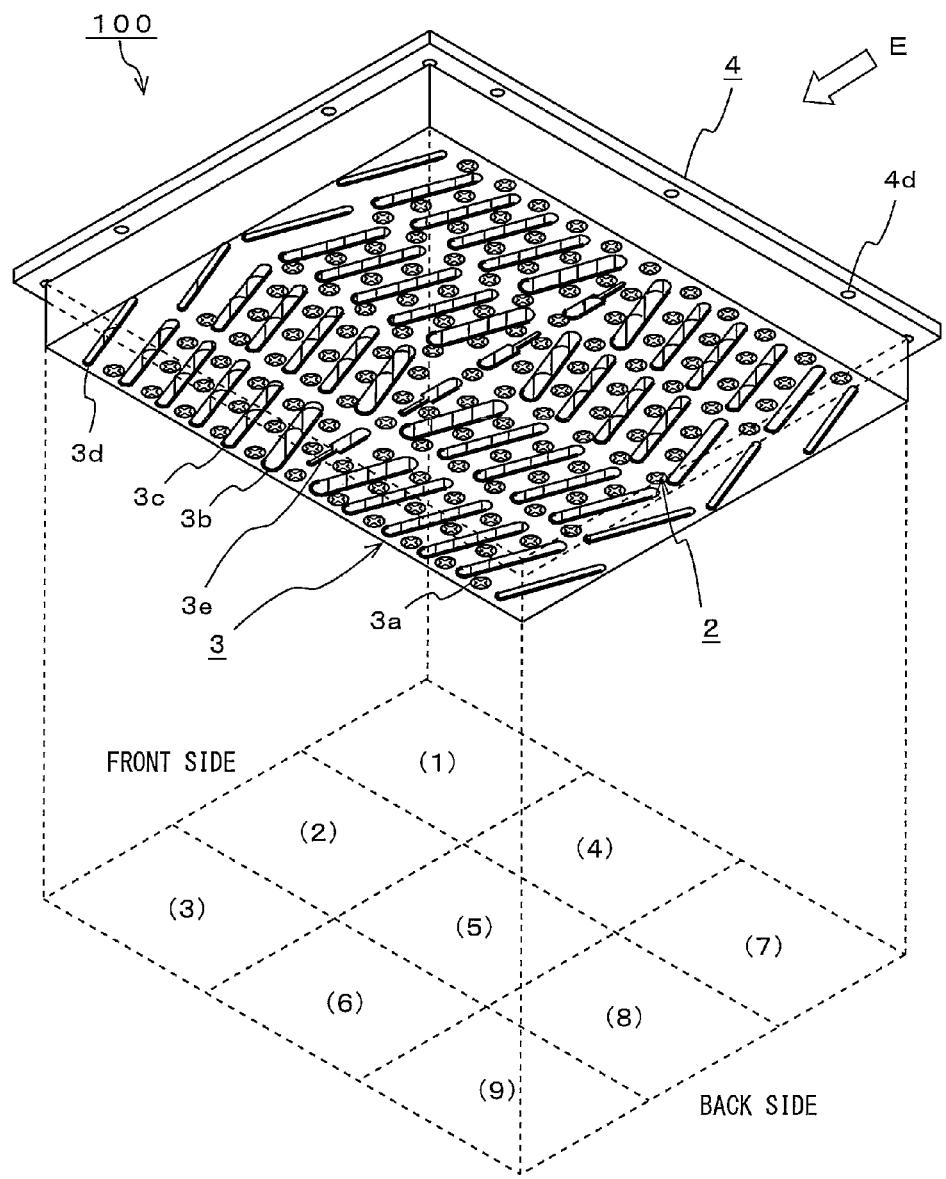
FIG. 13 is a perspective view of the nozzle device 100 for showing a region-setting example when measuring temperature within the furnace thereof.

The heater portion 103 has a box body shown in FIG. 12 in which four rooms are divided along a vertical direction. These four rooms are an air blower room 51, a heat exchanging room 52, a heated air room 53 and an intake room 54, from above. Partition walls 511 (one of them is not shown) are provided on both sides in the air blower room 51. An end of the partition wall 511 is an opening 512 for blowing the heated air. Respective openings 512 are positioned apart from each other not at opposite positions. A blower 55 is positioned at a center of the air blower room 51. In this embodiment, a turbofan is used as this blower 55 and is driven by a motor 56 positioned at outside to rotate.

Passages 504, 504 are formed on both sides in the heat exchanging room 52. A heat source 57 is arranged inside the heat exchanging room 52. In the heat source 57, plural electro-thermal heaters, not shown, are arranged. In the heat source 57, electro power is supplied to the electro-thermal heaters to heat the electro-thermal heaters, so that the gas passes through the electro-thermal heaters, thereby heating the gas.

In a partition board 501 separating the air blower room 51 from the heat exchanging room 52, an intake port 502 is opened. The intake port 502 is positioned below the blower 55 and is opened to have a diameter that is rather smaller than a diameter of the turbofan of the blower 55.

The heated air room 53 communicates with the opening 512 of the air blower room 51 through the above-mentioned passages 504, 504 so that the heated air is sent from the air blower room 51 to the heated air room 53. The nozzle device 100 also serving as the partition is arranged between the heated air room 53 and the intake room 54. The intake room 54 communicates with the heat exchanging room 52 through the passage 503. Further, a lower portion of the intake room 54 constitutes a heating surface of the nozzle cover 3.

On the nozzle device 100, a plurality of blowing nozzles 2 stands zigzag as shown in FIG. 2A and they blow the heated air from the heated air room 53 below as shown like an arrow by broken lines in FIG. 2A. In other words, the nozzle device 100 communicates with a blowing side of the blower 55. The nozzle device 100 is attached to the upper heated air room 53.

When plural nozzle devices 100 are followed by each other along the conveying direction, a zigzag arrangement pattern is given so that the nozzle pattern P1 and the nozzle pattern P2 are alternately zigzagged. The nozzle cover 3 (see FIGS. 9A through 9C) having such an array structure that the blowing nozzles 2 as shown in FIG. 5 are line symmetry in the nozzle layout region Ia is also provided on each nozzle device 100.

According to the heater portions 103 providing with the above-mentioned nozzle device 100, the motor 56 is driven to rotate the blower 55. The gas heated by the heat source 57 is blown as the heated air from the nozzle device 100 into the reflow furnace 300. This allows the printed circuit board 200 to be heated so that the board can be soldered.

In this moment, by blowing the heated gas from holes 5a of the fixing plate 5 into the muffle of the reflow furnace 300 through the gas-flowing paths 24 and the outlets 22 of the blowing nozzles 2 and blowing the heated gas to the printed circuit board 200, the printed circuit board 200 is heated up to a predetermined temperature.

Further, the gas blowing to the printed circuit board 200 and reflected thereby is circulated into the heater portions 103 via the inlet ports 3b, 3c, 3d and 3e of the nozzle cover 3 and the inlet ports 4c of the attachment plate 4. A circulation is repeated such that the heater portions 103 again heat the gas thus circulated so that the heated air is blown from the blowing nozzles 2 to the muffle.

Thus, according to the reflow furnace 300 as the embodiment, there is provided with the nozzle devices 100 having the array structure in the nozzle cover 3 according to the invention so that the printed circuit board 200, the semiconductor wafer or the like can be very uniformly heated. Therefore, it is possible to provide the printed circuit board 200 with high reliability soldering electronic components or the semiconductor wafer with high reliability on which solder electrodes are formed.

Further, the nozzle devices 100 each having the nozzle cover 3 (having blocked nozzles) are arranged on upper and lower surfaces of the preliminary heating zone A, the heating zone B and the cooling zone C regarding the conveyance of the printed circuit board 200. Therefore, in the nozzle device 100, since the nozzle cover 3 can be used as common parts of the upper and lower surfaces thereof a manufacture of plural kinds of molds corresponding to the upper and lower surfaces thereof may be omitted, in contrast of a case where the nozzle cover 3 are not divided into four sections and the blowing nozzles 2 are arrayed.

<Characteristic Example of Nozzle Device 100>

The following will describe a characteristic example of the nozzle device 100 with reference to FIGS. 13 through 16D. First, the following will describe a region-setting example when measuring temperature of the nozzle device 100 within the furnace with reference to FIG. 13. The nozzle device 100 shown in FIG. 13 has a condition where it is attached to the upper heater portion 103 or the like of the reflow furnace 300. In this embodiment, the gas-blowing and intake surface region of the nozzle cover 3 is divided vertically and horizontally twice so that nine measurement points (three by three) are set. The measurement regions are formed as (1), (2) and (3) of front row; (4), (5) and (6) of middle row and (7), (8) and (9) of back row, in order from a front side to a back side.

Figure 14:
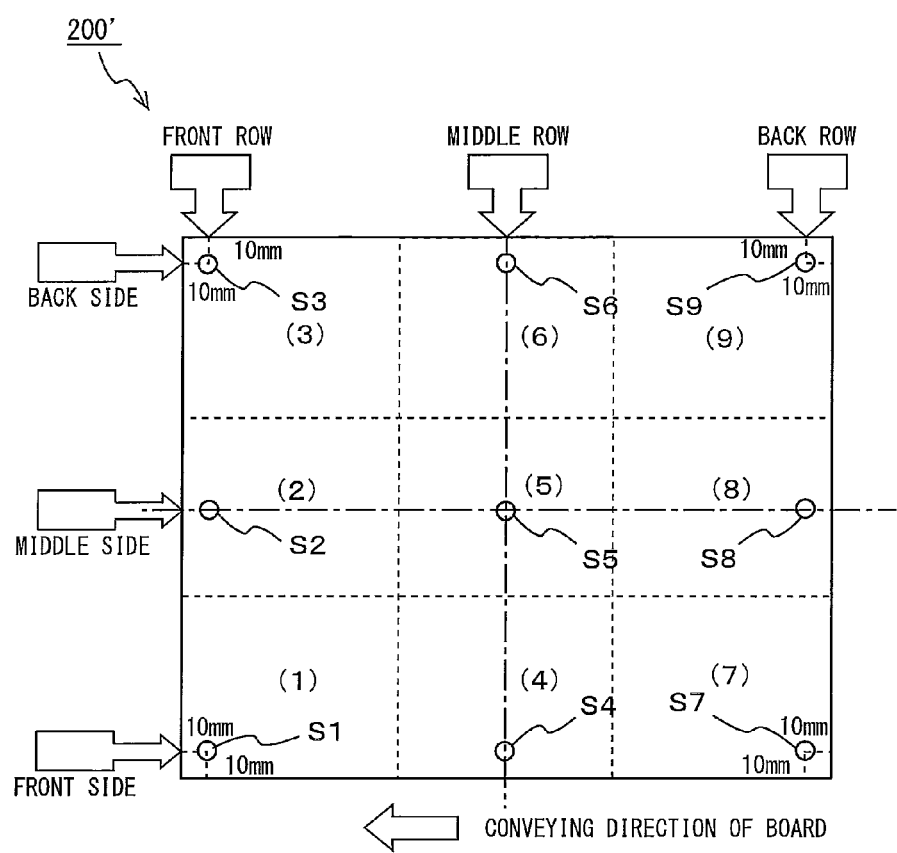
FIG. 14 is a top plan view of a test board 200' for measuring the temperature within the furnace for showing a configuration thereof.

The following will describe a configuration of a test board 200' for measuring the temperature within the furnace, which is used for measuring a distribution of the temperature of the nozzle device 100 within the furnace. The test board 200' shown in FIG. 14 is a measurement jig for measuring the distribution of the temperature within the furnace when mounting the nozzle devices 100 on the heater portions 103, 104 and nine temperature sensors S1 through S9 are mounted thereon. Each of the nozzle devices 100 includes the nozzle cover 3 shown in FIGS. 9A through 9C.

A size of the test board 200' has the same size as that of the printed circuit board having the largest width (for example, about 250 mm) of the boards to be used in the reflow furnace 300 on which the nozzle device 100 and the like are mounted.

In this embodiment, the upper surface region of the test board 200' is divided vertically and horizontally by twice so that nine measurement points (three by three) are set. The measurement regions are formed as (1), (4) and (7) of front side; (2), (5) and (8) of middle side and (3), (6) and (9) of back side, in order from a front side to a back side. The temperature sensors S1, S4 and S7 are arranged respectively corresponding to the measurement regions (1), (4) and (7) of the front side. The temperature sensors S2, S5 and S8 are arranged respectively corresponding to the measurement regions (2), (5) and (8) of the middle side.

The temperature sensors S3, S6 and S9 are arranged respectively corresponding to the measurement regions (3), (6) and (9) of the back side. The temperature sensor S5 is arranged on a center portion of the test board 200'. The other remaining temperature sensors S1 through S4 and S6 through S9 are respectively arranged at points by 10 mm away from the ends of the test board 200'. Thus, the measurement jig is obtained such that the temperature sensors S1 through S3 are arranged on front row, the temperature sensors S4 through S6 are arranged on middle row and the temperature sensors S7 through S9 are arranged on back row along the conveying direction of the test board 200'.

Figures 15, 16A:
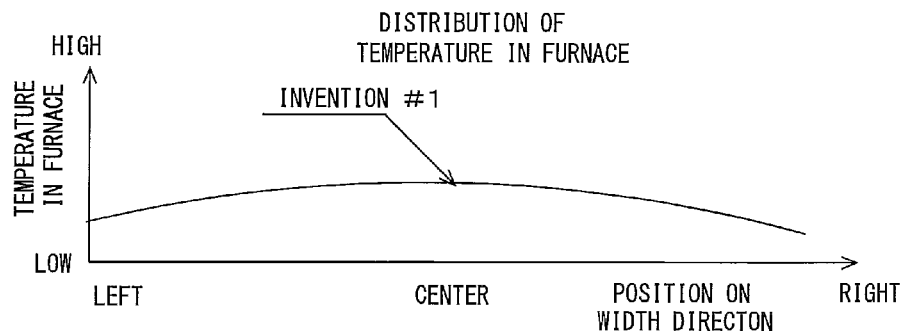
FIG. 15 is a table for showing a result of the measurement of the temperature within the furnace when mounting the nozzle device 100.
FIG. 16A is a graph for explaining a distribution example of the temperature within the furnace in relation to positions in the nozzle device 100 according to the invention #1.
Figure 17:
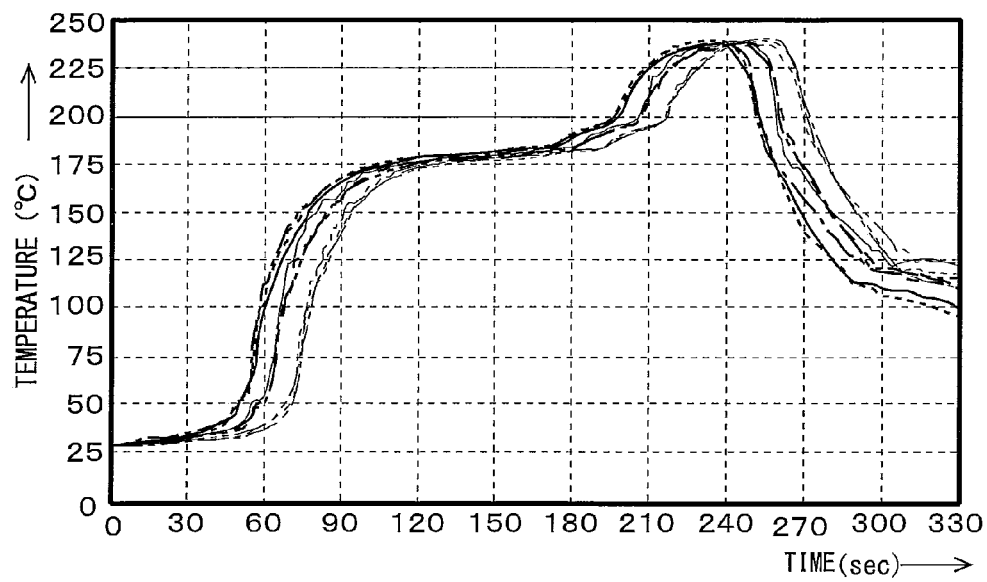
FIG. 17 is a reference view for showing a temperature profile when measuring the temperature of the nozzle device 100 within the furnace.

The following will describe the distribution of the temperature of the nozzle device 100 mounting the nozzle cover 3 within the furnace. It is to be noted that the table shown in FIG. 15 is tabularized from a temperature profile shown in FIG. 17 as reference drawing. In the measurement of the distribution of the temperature within the furnace, the following measurement conditions were set in a case where 5 heater portions 103 were mounted in the preliminary heating zone A of the reflow furnace 300 shown in FIG. 11 and 3 heater portions 104 were mounted in the heating zone B thereof.

The heating temperatures of 5 heater portions 103 of the preliminary heating zone A were respectively set to be 180 degrees C., 180 degrees C., 180 degrees C., 180 degrees C., and 185 degrees C. The heating temperatures of 3 heater portions 104 of the heating zone B were respectively set to be 200 degrees C., 250 degrees C. and 245 degrees C. The conveying speed of the test board 200' was set to be 0.9 m/min. The temperature within the furnace was measured in nine (three by three) measurement points ((1) through (9)) of the test board 200'. The temperature profile was obtained. Here, difference Δt between peak temperatures was obtained when the maximum of the highest temperatures of the nine measurement points (1) through (9) is θmax and the minimum of the highest temperatures of the nine measurement points (1) through (9) is θmin.

In a case where the nozzle devices 100 according to the invention with the nozzle covers 3 are mounted on the heater portions 103, 104, the difference Δt between peak temperatures was 2.9 degrees C. by θmax−θmin. According to the nozzle devices 100 with the nozzle covers 3, the highest temperature, 240.4 degrees C. (the maximum) was measured at an elapsed time of 255 seconds in the measurement point (8) and the highest temperature, 237.5 degrees C. (the minimum) was measured at an elapsed time of 235 seconds in the measurement point (1). The difference Δt between the peak temperatures was 2.9 degrees C. by θmax−θmin.

Here, the following will describe the distribution of the temperature of the nozzle devices 100 according to the invention within the furnace under the condition such that it is possible to uniformly heat the printed circuit board 200 according to the invention, thereby much improving heating efficiency, with reference to FIGS. 16A through 16D.

Figure 16B:
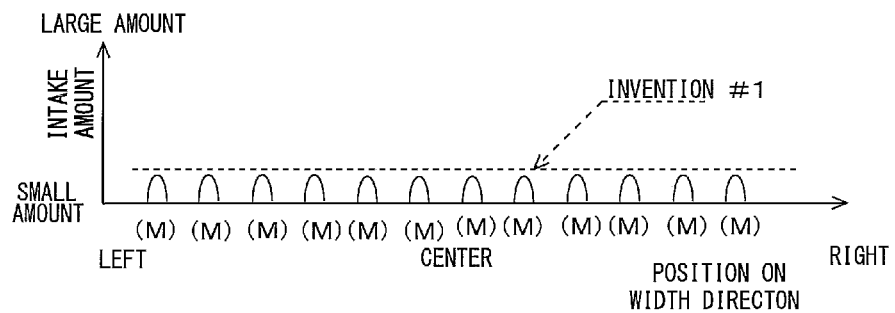
FIG. 16B is a graph for explaining a distribution example of an intake amount in relation to positions in the nozzle device 100 according to the invention #1.

In respective FIGS. 16A through 16D, a horizontal axis indicates a position on width direction of the nozzle cover 3. In respective FIGS. 16A through 16D, a vertical axis indicates temperature with in the reflow furnace 300. The temperature rises toward the upper side while the temperature drops toward the lower side. FIGS. 16A and 16B show the distribution of the temperature within the furnace when the widths of intake ports 3b, 3c and 3d in this invention are fixed to be (middle) (in the respective drawings, referred to as "the invention #1"), which show characteristic curves each indicating the distribution of the temperature within the furnace in a case where an amount of air is 40%. Concerning the intake from the intake ports 3b, 3c and 3d of this moment, since the widths of intake ports 3b, 3c and 3d are fixed to be (middle) as shown in FIG. 16B, a total intake characteristic shown in FIG. 16B shows flat characteristic in which an intake amount at the center portion is similar to an intake amount at each of the right and left ends.

Figure 16C:
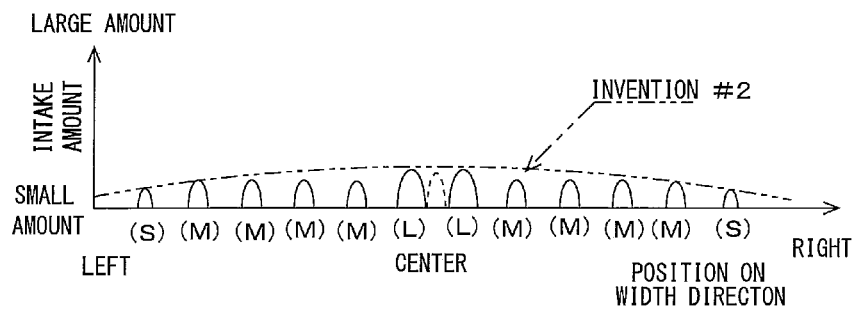
FIG. 16C is a graph for explaining a distribution example of an intake amount in relation to positions in the nozzle device 100 according to the invention #2.
Figure 16D:
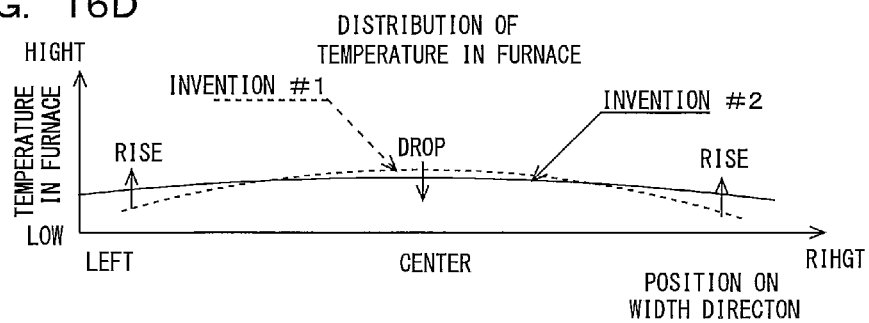
FIG. 16D is a graph for explaining a distribution example of the temperature within the furnace in relation to positions in the nozzle device 100 according to the invention #2.

FIGS. 16C and 16D show a case of this invention where the intake ports are formed so that they become gradually narrower with increasing distance from the center portion (in the respective drawings, referred to as "the invention #2"). FIGS. 16C and 16D show characteristic of the intake amount by each of the intake ports, the small intake port 3d having the opening width w1, the meddle intake port 3c having the opening width w2 and the large intake port 3b having the opening width w3, in a case where an amount of air is 100%. The broken line shown in the drawing indicates characteristic by the long oval intake port 3e. The intake amount of the small intake port 3d is smaller than that of the meddle intake port 3c based on the intake amount of the meddle intake port 3c. The intake amount of the large intake port 3b is larger than that of the meddle intake port 3c.

Chain double-dashed line shown in FIG. 16C indicates a total intake characteristic of the nozzle cover 3 according to the invention in a case where the intake ports are formed so that they become gradually narrower with increasing distance from the center portion. As compared with the flat total intake characteristic in a case where the intake ports are fixedly formed in this invention, the intake amount at the center portion is large and the intake amount by each of the right and left ends is small.

The solid line shown in FIG. 16D indicates a characteristic curve indicating the distribution of the temperature within the furnace in a case where the gas is drawn when an amount of air is 100% in the nozzle cover 3 having the total intake characteristic according to the invention in a case where the intake ports are formed so that they become gradually narrower with increasing distance from the center portion. As compared with the characteristic curve indicating the total intake characteristic in a case where the intake ports are fixedly formed in this invention when an amount of air is 100%, which is shown by the broken line, and the distribution of the temperature within the furnace in a case where the gas is drawn, it has a tendency such that the temperature of the center portion of the furnace drops while the temperature of each of the right and left ends rises more than that of the center portion. This allows the distribution of the temperature within the furnace to be very uniformly adjusted.

Although the invention has been described on a case where the soldering is performed by blowing the heated air to the board, it goes without saying that the invention is also applicable to a case where the board is cooled by blowing the cooled gas to the soldered board.

INDUSTRIAL AVAILABILITY

The invention is very preferably applicable to a nozzle device blowing the heated air to a conveyed member such as a printed circuit board, a semiconductor wafer or the like in a heating zone and blowing the cooled air in a cooling zone as well as a reflow furnace mounting such a nozzle device.

DESCRIPTION OF CODES

2; Blowing Nozzles (Gas-blowing Holes),
3; Nozzle Cover (Gas-blowing Hole Plate),
3a, 4a, 5a and 4d; Holes
3b, 3c, 3d and 3e; Intake Ports (Gas-intake Oval Ports)
4; Attachment Plate,
4b; Fitting Groove,
4c; Intake Port,
5; Fixing Plate,
21; Main Body,
21a; Projected Portion,
22; Outlet,
24; Gas-flowing Path,
100; Nozzle Device, and
300; Reflow Furnace (Soldering Apparatus)

The invention claimed is:

1. A gas-intake-port array structure of a gas-blowing-holes plate in a soldering apparatus for performing soldering by discharging gas from plural gas-blowing holes arranged in the gas-blowing-holes plate and blowing the gas to a board to be soldered while a conveyed member, which mounts the board, is conveyed, comprising:
   the gas-blowing-holes plate having a predetermined nozzle layout region;
   wherein the nozzle layout region is divided into four divided sections;
   wherein in an arrangement pattern of the gas-blowing holes arranged in one of the divided sections:
      a first row is formed so that first and second gas-blowing holes are arranged with a predetermined opening width pitch along a direction that is orthogonal to a conveying direction of the conveyed member,
      plural other rows are formed with a predetermined row arrangement pitch along the conveying direction with them being parallel to the first row,
      the first gas-blowing hole in every other row is arranged with a predetermined space along a width direction from the first gas-blowing hole in every other row; and
      the first gas-blowing holes in the first row and other rows have such a configuration that they have different phases from each other on the orthogonal direction;
   wherein in the divided sections of upper and lower opposite sides relative to a center portion of the nozzle layout region in which the width direction and the conveying direction are orthogonal to each other, a first arrangement pattern of the gas-blowing holes and a second arrangement pattern of the gas-blowing holes, which is an inverse first arrangement pattern thereof, are provided so that the arrangement patterns that are arranged on a diagonal line in the nozzle layout region are identical; and wherein gas intake oval ports each having a predetermined opening width for circulating the gas blown from the gas-blowing holes are arranged between the first and second gas-blowing holes and across the first row and the plural other rows having different phases and the opening widths of the oval ports are formed so as to be gradually narrower with increasing distance from the center portion.

2. The gas-intake-port array structure according to claim 1 wherein the gas-intake oval ports are arranged like V shape and inverse V shape in upper and lower divided sections of the nozzle layout region.

3. The gas-intake-port array structure according to claim 1 wherein each of the gas-blowing holes includes crisscross opening in a forward end thereof.

4. In a gas-intake-port array structure of a gas-blowing-holes plate in a soldering apparatus for performing soldering by discharging gas from plural gas-blowing holes arranged in the gas-blowing-holes plate and blowing the gas to a board to be soldered while a conveyed member, which mounts the board, is conveyed, the soldering apparatus is provided with the gas-blowing-holes plate having the gas-intake-port array structure claimed in claim 1.

* * * * *

UNITED STATES PATENT AND TRADEMARK OFFICE
CERTIFICATE OF CORRECTION

| | | |
|---|---|---|
| PATENT NO. | : 9,511,379 B2 | Page 1 of 1 |
| APPLICATION NO. | : 14/654939 | |
| DATED | : December 6, 2016 | |
| INVENTOR(S) | : Hiyama | |

It is certified that error appears in the above-identified patent and that said Letters Patent is hereby corrected as shown below:

In the Specification

Column 12, Line 47, "H53 and H54 N53 and N51 on" should read --H53 and H54 on--.

Signed and Sealed this
Twenty-eighth Day of February, 2017

Michelle K. Lee
*Director of the United States Patent and Trademark Office*